(12) United States Patent
Hsieh

(10) Patent No.: US 11,159,174 B2
(45) Date of Patent: Oct. 26, 2021

(54) MULTIPLYING DIGITAL-TO-ANALOG CONVERTER WITH PRE-SAMPLING AND ASSOCIATED PIPELINED ANALOG-TO-DIGITAL CONVERTER

(71) Applicant: MEDIATEK INC., Hsin-Chu (TW)

(72) Inventor: Sung-En Hsieh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/076,785

(22) Filed: Oct. 21, 2020

(65) Prior Publication Data

US 2021/0126647 A1   Apr. 29, 2021

Related U.S. Application Data

(60) Provisional application No. 62/925,270, filed on Oct. 24, 2019.

(51) Int. Cl.
*H03M 1/66* (2006.01)
*H03M 1/12* (2006.01)
(Continued)

(52) U.S. Cl.
CPC .......... *H03M 1/66* (2013.01); *H03M 1/1014* (2013.01); *H03M 1/1245* (2013.01); *H03M 1/183* (2013.01); *H03M 1/466* (2013.01)

(58) Field of Classification Search
CPC .... H03M 1/66; H03M 1/1245; H03M 1/1014; H03M 1/183
See application file for complete search history.

(56) References Cited

U.S. PATENT DOCUMENTS 5,555,200 A * 9/1996 Chiang .............. H03H 21/0012
                                                    708/7
7,116,255 B2 * 10/2006 Lee .................... H03M 1/0604
                                                    341/144
(Continued)

FOREIGN PATENT DOCUMENTS

WO        2017/106835 A1    6/2017

OTHER PUBLICATIONS

Hershberg, "Design of a Split-CLS Pipelined ADC With Full Signal Swing Using an Accurate But Fractional Signal Swing Opamp", IEEE Journal of Solid-State Circuits, vol. 45, No. 12, pp. 2623-2633, Dec. 2010.

(Continued)

*Primary Examiner* — Peguy Jean Pierre
(74) *Attorney, Agent, or Firm* — Winston Hsu

(57) ABSTRACT

A multiplying digital-to-analog converter (MDAC) includes an operational amplifier, a sampling capacitor circuit, a pre-sampling capacitor circuit, and a switch circuit. During a sampling cycle, the switch circuit connects a pre-defined voltage and reference voltages to the pre-sampling capacitor circuit, disconnects the pre-sampling capacitor circuit from an input port of the operational amplifier and the sampling capacitor circuit, disconnects an output port of the operational amplifier from the sampling capacitor circuit, and connects a voltage input to the sampling capacitor circuit. During a conversion cycle, the switch circuit connects the pre-sampling capacitor circuit to the sampling capacitor circuit, disconnects the pre-defined voltage and the reference voltages from the pre-sampling capacitor circuit, connects the pre-sampling capacitor circuit to the input port of the operational amplifier, connects the output port of the operational amplifier to the sampling capacitor circuit, and dis- (Continued)

connects the voltage input from the sampling capacitor circuit.

33 Claims, 17 Drawing Sheets

(51) Int. Cl.
    *H03M 1/10*           (2006.01)
    *H03M 1/18*           (2006.01)
    *H03M 1/46*           (2006.01)

(56) References Cited

U.S. PATENT DOCUMENTS

| | | | |
|---|---|---|---|
| 9,112,523 B1* | 8/2015 | Ford | H03M 1/0609 |
| 2014/0055295 A1* | 2/2014 | Hemes | H03M 1/1061 |
| | | | 341/161 |

OTHER PUBLICATIONS

Murmann, ADC Performance Survey 1997-2020, hhttps://web.stanford.edu/~murmann/adcsurvey.html ,Aug. 2, 2020.
Nam, "A 12-bit 1.6 GS/s Interleaved SAR ADC with Dual Reference Shifting and Interpolation Achieving 17.8 fJ/conv-step in 65nm CMOS", 2016 Symposium on VLSI Circuits Digest of Technical Papers.
Hershberg, "A 6-to-600MS/s Fully Dynamic Ringamp Pipelined ADC with Asynchronous Event-Driven Clocking in 16nm", ISSCC 2019 / Session 3 / Nyquist Rate ADCs / 3.6, pp. 68-69 and a page including Figure 3.6.7.
Jiang, "A 7.6mW 1GS/s 60dB SNDR Single-Channel SAR-Assisted Pipelined ADC with Temperature-Compensated Dynamic Gm-R-Based Amplifier", ISSCC 2019 / Session 3 / Nyquist Rate ADCs / 3.2, pp. 60-61 and a page including Figure 3.2.7.
Hershberg, "A 3.2GS/s 10 ENOB 61mW Ringamp ADC in 16nm with Background Monitoring of Distortion", ISSCC 2019 / Session 3 / Nyquist Rate ADCs / 3.1, pp. 58-59 and a page including Figure 3.1.7.
Quinn, P. J. et al., Capacitor Matching Insensitive High-Resolution Low-Power ADC Concept, Chapter 9: Capacitor Matching Insensitive ADC Concept, 2007, Springer Netherlands, pp. 193-202, XP055781939,2007.
Patrick Quinn et al., Capacitor matching insensitive algorithmic ADC requiring no calibrations, INTEGRATION, the VLSI journal 36 (2003), pp. 211-228, Elsevier, XP004476846, 2003.
Imran Ahmed et al., A Low-Power Capacitive Charge Pump Based Pipelined ADC , IEEE Journal of Solid-State Circuits, vol. 45, No. 5, May 2010, IEEE, pp. 1016-1027, XP011308053, May 2010.
B. Robert Gregoire et al., An Over-60 dB True Rail-to-Rail Performance Using Correlated Level Shifting and an Opamp With Only 30 dB Loop Gain, IEEE Journal of Solid-State Circuits, vol. 43, No. 12, Dec. 2008, IEEE, pp. 2620-2630, XP011238647, Dec. 2008.

\* cited by examiner

MULTIPLYING DIGITAL-TO-ANALOG CONVERTER WITH PRE-SAMPLING AND ASSOCIATED PIPELINED ANALOG-TO-DIGITAL CONVERTER

CROSS REFERENCE TO RELATED APPLICATIONS

This application claims the benefit of U.S. provisional application No. 62/925,270, filed on Oct. 24, 2019 and incorporated herein by reference.

BACKGROUND

The present invention relates to conversion between an analog signal and a digital signal, and more particularly, to a multiplying digital-to-analog converter (MDAC) with pre-sampling and an associated pipelined analog-to-digital converter (ADC).

Analog-to-digital converters (ADCs) are employed in a variety of electronic systems. Such systems demand cost-effective ADCs that can efficiently convert an analog input signal to a digital output signal over a wide range of frequencies and signal magnitudes with minimal noise and distortion.

An ADC typically converts an analog signal to a digital signal by sampling the analog signal at pre-determined sampling intervals and generating a sequence of binary numbers via a quantizer, wherein the sequence of binary numbers is a digital representation of the sampled analog signal. Some of the commonly used types of ADCs include Flash ADCs, pipelined ADCs, successive approximation register (SAR) ADCs, etc. Of these various types, the pipelined ADCs are particularly popular in applications requiring higher resolutions. The typical pipelined ADCs use switched capacitor circuits to add or subtract charges and active circuits like operational amplifiers to realize multiplication, they are highly susceptible to component mismatch like capacitor mismatches and circuit imperfections like finite amplifier gains. Furthermore, the typical pipelined ADC may employ a high gain and high speed operational amplifier which has high power consumption and requires background calibration. Thus, there is a need for an innovative low-power pipelined ADC without background calibration.

SUMMARY

One of the objectives of the claimed invention is to provide a multiplying digital-to-analog converter (MDAC) with pre-sampling and an associated pipelined analog-to-digital converter (ADC).

According to a first aspect of the present invention, an exemplary multiplying digital-to-analog converter (MDAC) is disclosed. The exemplary MDAC includes an operational amplifier, a sampling capacitor circuit, a pre-sampling capacitor circuit, and a switch circuit. The operational amplifier has an input port and an output port. The switch circuit is arranged to control interconnection between the operational amplifier, the sampling capacitor circuit, and the pre-sampling capacitor circuit. During a sampling cycle of the MDAC, the switch circuit is arranged to connect a pre-defined voltage to the pre-sampling capacitor circuit, connect a plurality of reference voltages to the pre-sampling capacitor circuit, disconnect the pre-sampling capacitor circuit from the input port of the operational amplifier, disconnect the pre-sampling capacitor circuit from the sampling capacitor circuit, disconnect the output port of the operational amplifier from the sampling capacitor circuit, and connect a voltage input of the MDAC to the sampling capacitor circuit. During a conversion cycle of the MDAC, the switch circuit is arranged to connect the pre-sampling capacitor circuit to the sampling capacitor circuit, where a configuration of connection between the pre-sampling capacitor circuit and the sampling capacitor circuit depends on a quantization result of the voltage input, and is further arranged to disconnect the pre-defined voltage from the pre-sampling capacitor circuit, disconnect said plurality of reference voltages from the pre-sampling capacitor circuit, connect the pre-sampling capacitor circuit to the input port of the operational amplifier, connect the output port of the operational amplifier to the sampling capacitor circuit, and disconnect the voltage input from the sampling capacitor circuit.

According to a second aspect of the present invention, an exemplary pipelined analog-to-digital converter (ADC) is disclosed. The exemplary pipelined ADC includes a plurality of stages and a combining circuit. The stages are arranged to generate a plurality of digital outputs, respectively. The combining circuit is arranged to combine said plurality of digital outputs. At least one of said plurality of stages includes a quantization circuit and a multiplying digital-to-analog converter (MDAC). The quantization circuit is arranged to generate a quantization result of a voltage input of said at least one of said plurality of stages, wherein a digital output of said at least one of said plurality of stages depends on the quantization result of the voltage input. The MDAC includes an operational amplifier, a sampling capacitor circuit, a pre-sampling capacitor circuit, and a switch circuit. The operational amplifier has an input port and an output port. The switch circuit is arranged to control interconnection between the operational amplifier, the sampling capacitor circuit, and the pre-sampling capacitor circuit. During a sampling cycle of the MDAC, the switch circuit is arranged to connect a pre-defined voltage to the pre-sampling capacitor circuit, connect a plurality of reference voltages to the pre-sampling capacitor circuit, disconnect the pre-sampling capacitor circuit from the input port of the operational amplifier, disconnect the pre-sampling capacitor circuit from the sampling capacitor circuit, disconnect the output port of the operational amplifier from the sampling capacitor circuit, and connect a voltage input of the MDAC to the sampling capacitor circuit. During a conversion cycle of the MDAC, the switch circuit is arranged to connect the pre-sampling capacitor circuit to the sampling capacitor circuit, where a configuration of connection between the pre-sampling capacitor circuit and the sampling capacitor circuit depends on the quantization result of the voltage input, and is further arranged to disconnect the pre-defined voltage from the pre-sampling capacitor circuit, disconnect said plurality of reference voltages from the pre-sampling capacitor circuit, connect the pre-sampling capacitor circuit to the input port of the operational amplifier, connect the output port of the operational amplifier to the sampling capacitor circuit, and disconnect the voltage input from the sampling capacitor circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
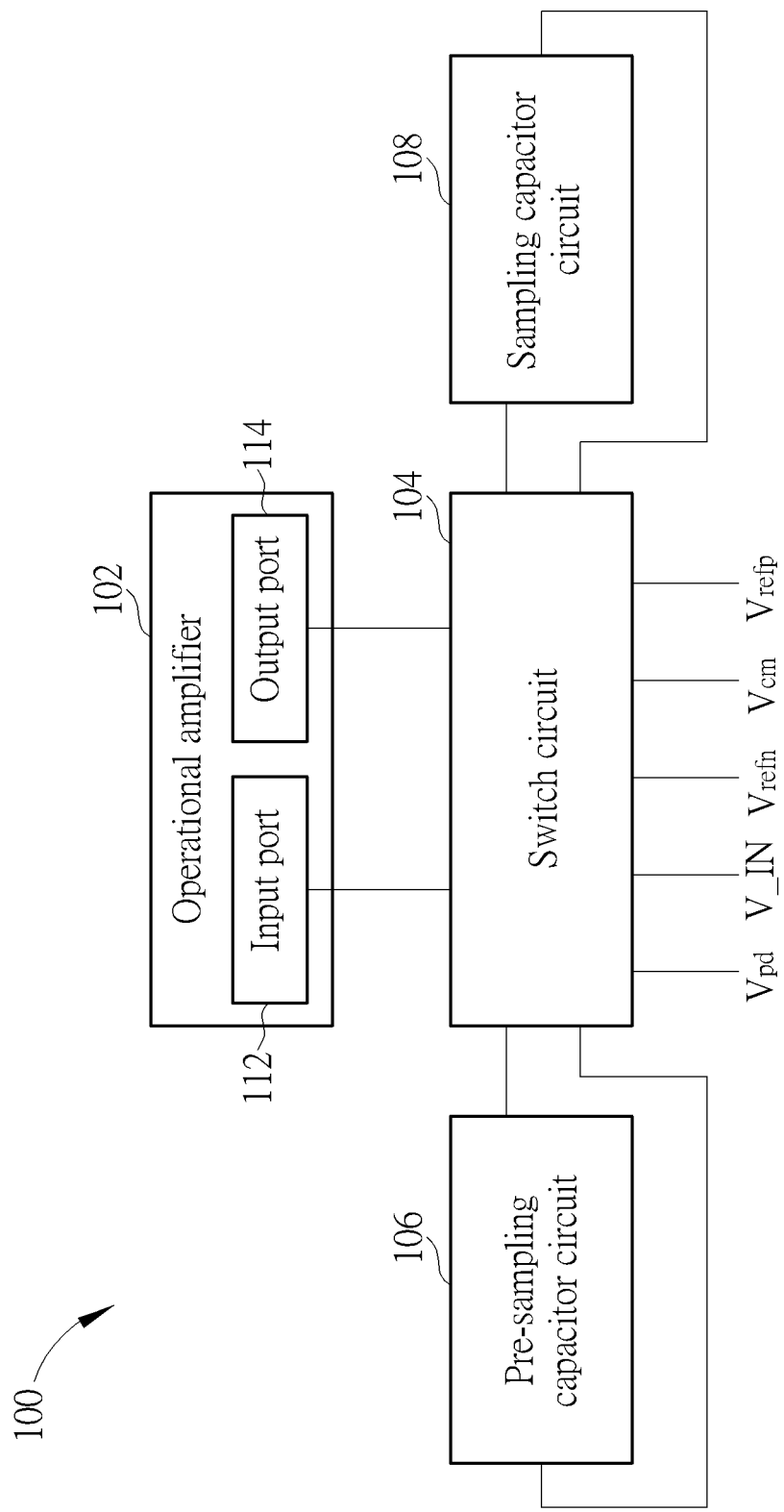
FIG. 1 is a block diagram illustrating a multiplying digital-to-analog converter (MDAC) with pre-sampling according to an embodiment of the present invention.

FIG. 1 is a block diagram illustrating a multiplying digital-to-analog converter (MDAC) with pre-sampling according to an embodiment of the present invention. The MDAC 100 includes an operational amplifier 102, a switch circuit 104, and a plurality of capacitive circuits including a pre-sampling capacitor circuit 106 and a sampling capacitor circuit 108. The operational amplifier 102 has an input port 112 and an output port 114. For example, the input port 112 may include a non-inverting input node (+) and an inverting input node (−), and the output port 114 may include a non-inverting output node (+) and an inverting output node (−). Since the MDAC 100 is a switched capacitor circuit, the switch circuit 104 is arranged to control interconnection between the operational amplifier 102, the sampling capacitor circuit 108, and the pre-sampling capacitor circuit 106.

An operation of the DAC-subtract-gain function performed by the MDAC 100 may be divided into a sampling cycle and a conversion cycle following the sampling cycle. During the sampling cycle of the MDAC 100, the switch circuit 104 is arranged to connect a pre-defined voltage $V_{pd}$ to the pre-sampling capacitor circuit 106, connect a plurality of reference voltages (e.g., $V_{refn}$, $V_{cm}$, and $V_{refp}$, where $V_{refp}>V_{cm}>V_{refn}$ and $V_{cm}=V_{refp}+V_{refn}=0V$) to the pre-sampling capacitor circuit 106, disconnect the pre-sampling capacitor circuit 106 from the input port 112 of the operational amplifier 102, disconnect the pre-sampling capacitor circuit 106 from the sampling capacitor circuit 108, disconnect the output port 114 of the operational amplifier 102 from the sampling capacitor circuit 108, and connect a voltage input V_IN of the MDAC 100 to the sampling capacitor circuit 108. For example, the voltage input V_IN may be a differential input including a positive signal $V_{ip}$ and a negative signal $V_{in}$ (i.e., V_IN=$V_{ip}-V_{in}$).

During the conversion cycle of the MDAC 100, the switch circuit 104 is arranged to connect the pre-sampling capacitor circuit 106 to the sampling capacitor circuit 108, where a configuration of connection between the pre-sampling capacitor circuit 106 and the sampling capacitor circuit 108 depends on a quantization result of the voltage input V_IN, and the switch circuit 104 is further arranged to disconnect the pre-defined voltage $V_{pd}$ from the pre-sampling capacitor circuit 106, disconnect the reference voltages (e.g., $V_{refn}$, $V_{cm}$, and $V_{refp}$) from the pre-sampling capacitor circuit 106, connect the pre-sampling capacitor circuit 106 to the input port 112 of the operational amplifier 102, connect the output port 114 of the operational amplifier 102 to the sampling capacitor circuit 108, and disconnect the voltage input V_IN from the sampling capacitor circuit 108. The use of the pre-sampling capacitor circuit 106 can achieve operational amplifier power relaxation as well as reference buffer power relaxation.

Figure 2:
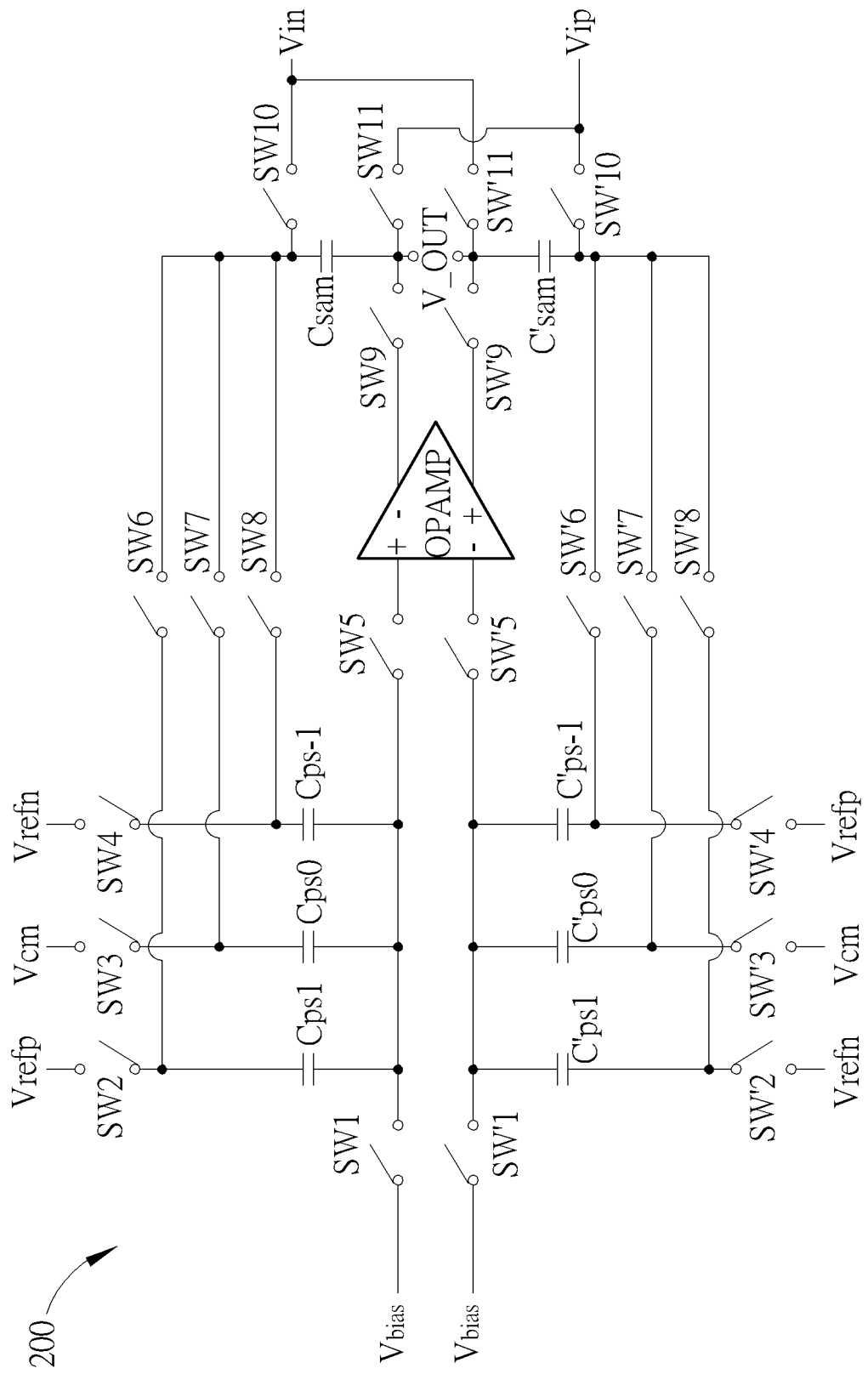
FIG. 2 is a circuit diagram of an MDAC with pre-sampling according to an embodiment of the present invention.

FIG. 2 is a circuit diagram of an MDAC with pre-sampling according to an embodiment of the present invention. The MDAC 100 shown in FIG. 1 may be implemented by the MDAC 200 shown in FIG. 2. The MDAC 200 includes an operational amplifier OPAMP, a plurality of pre-sampling capacitors $C_{ps1}$, $C_{ps0}$, $C_{ps-1}$, $C'_{ps1}$, $C'_{ps0}$, $C'_{ps-1}$, a plurality of sampling capacitors $C_{sam}$, $C'_{sam}$, and a plurality of switches SW1, SW2, SW3, SW4, SW5, SW6, SW7, SW8, SW9, SW10, SW11, SW'1, SW'2, SW'3, SW'4, SW'5, SW'6, SW'7, SW'8, SW'9, SW10, SW'11. The operational amplifier 102 shown in FIG. 1 may be implemented using the operational amplifier OPAMP shown in FIG. 2, where the operational amplifier OPAMP is a differential amplifier having an input port consisting of a non-inverting input node (+) and an inverting input node (−) and an output port consisting of an inverting output node (−) and a non-inverting output node (+). The pre-sampling capacitor circuit 106 shown in FIG. 1 may be implemented using the pre-sampling capacitors $C_{ps1}$, $C_{ps0}$ $C_{ps-1}$, $C'_{ps1}$, $C'_{ps0}$, $C'_{ps-1}$ shown in FIG. 2. The sampling capacitor circuit 108 shown in FIG. 1 may be implemented using sampling capacitors $C_{sam}$, $C'_{sam}$ shown in FIG. 2. The switch circuit 104 shown in FIG. 1 may be implemented using switches SW1-SW11, SW'1-SW'11 shown in FIG. 2.

Figure 3:
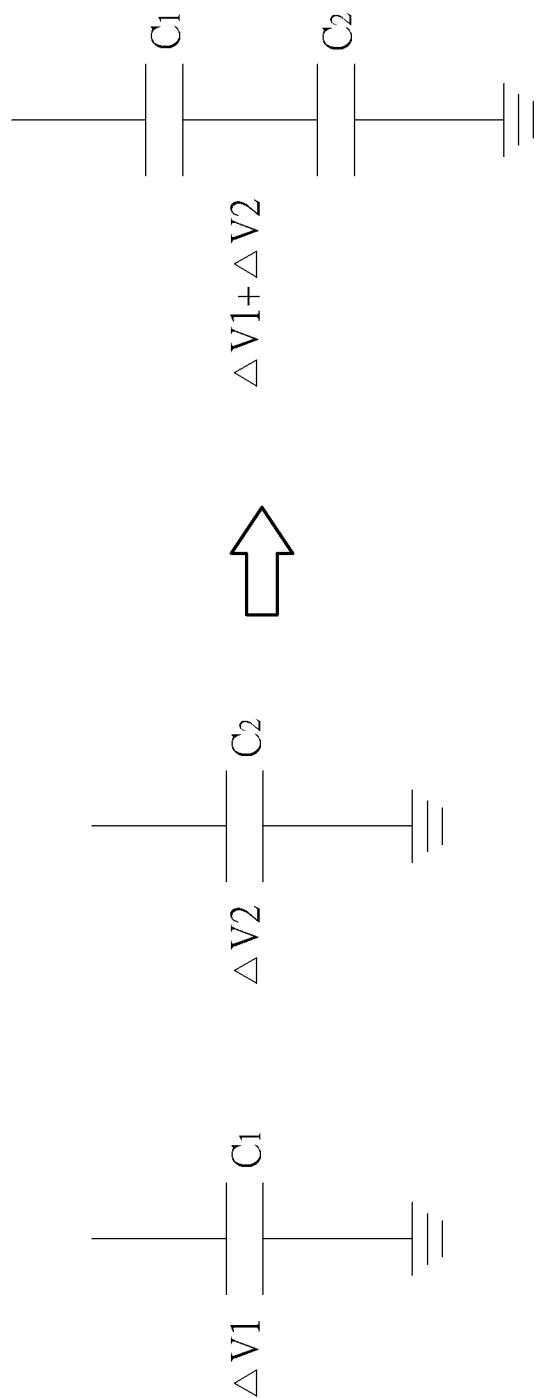
FIG. 3 is a diagram illustrating the principle of the proposed MDAC design with pre-sampling according to an embodiment of the present invention.
Figure 4:
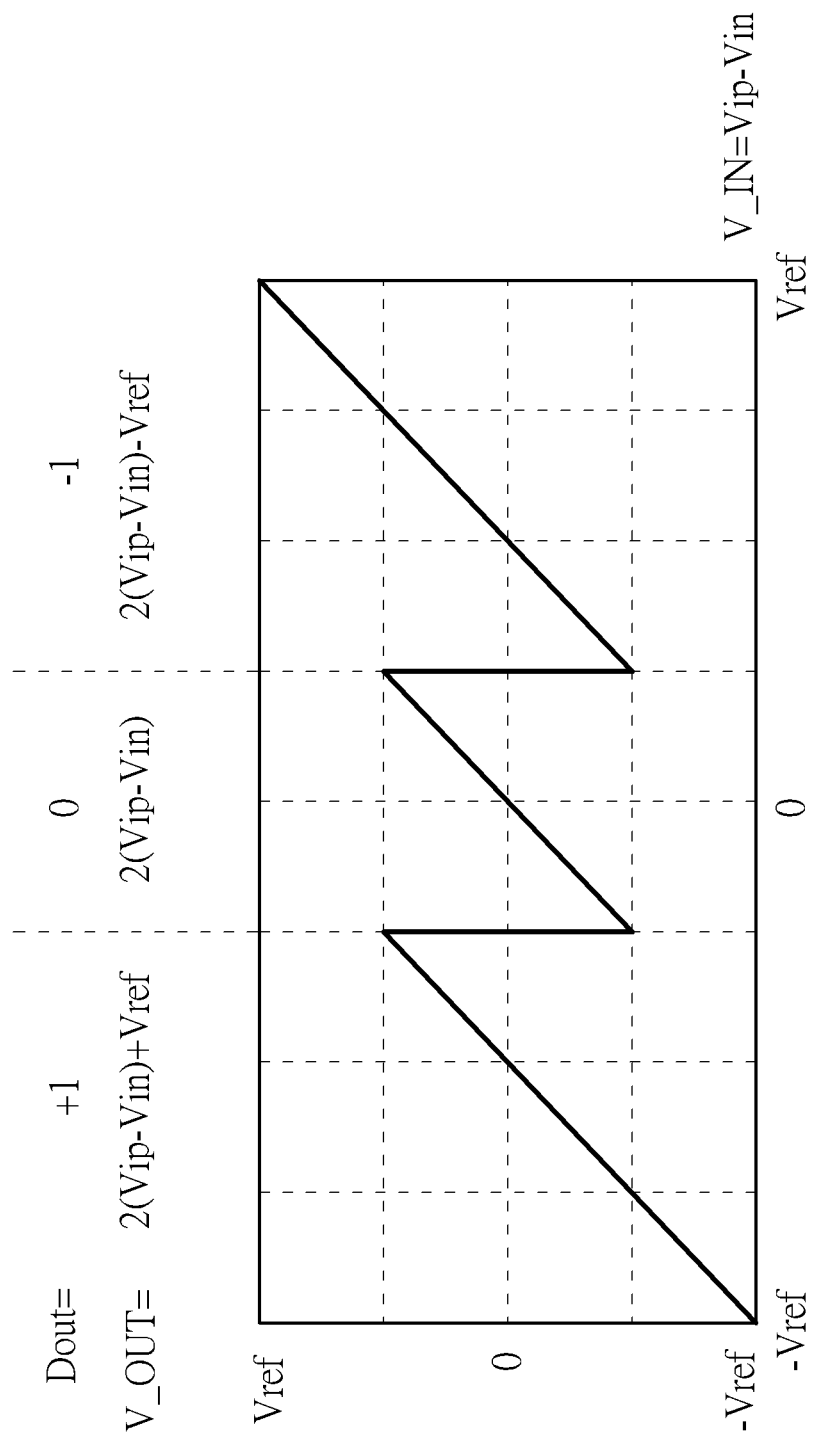
FIG. 4 is a diagram illustrating a transfer curve of the MDAC shown in FIG. 2.

The pre-sampling capacitors $C_{ps1}$, $C_{ps0}$ $C_{ps-1}$, $C'_{ps1}$, $C'_{ps0}$, $C'_{ps-1}$ are used to pre-sample $V_{ref}$, 0V, and $-V_{ref}$, where $V_{refp}-V_{refn}=V_{ref}$, $V_{refn}-V_{refp}=-V_{ref}$, and $V_{cm}=0V$. The sampling capacitors $C_{sam}$ and $C'_{sam}$ are used to sample a voltage input $(V_{ip}-V_{in})$ that is a differential input consisting of a positive signal $V_{ip}$ and a negative signal V. The principle of the proposed MDAC design with pre-sampling is to combine voltage differences held by capacitors to achieve reference voltage subtraction and input voltage amplification. FIG. 3 is a diagram illustrating the principle of the proposed MDAC design with pre-sampling according to an embodiment of the present invention. Suppose that one voltage difference ΔV1 is held between a top plate and a bottom plate of the capacitor C1, and another voltage difference ΔV2 is held between a top plate and a bottom plate of the capacitor C2. When the capacitors C1 and C2 are connected in series, the voltage across the series-connected capacitors C1 and C1 is equal to ΔV1+ΔV2. Regarding the MDAC 200, the voltage output V_OUT acts as an MDAC output, and), and is determined by $ΔV1=2*(V_{ip}-V_{in})$ and $ΔV2=D_{out}*V_{ref}$, that is, $V\_OUT=2*(V_{ip}-V_{in})+D_{out}*V_{ref}$. The voltage $2*(V_{ip}-V_{in})$ is achieved via sampling capacitors. The voltage $D_{out}*V_{ref}$ is achieved via pre-sampling capacitors and pre-sampling capacitor selection. FIG. 4 is a diagram illustrating a transfer curve of the MDAC 200 shown in FIG. 2. If $(V_{ip}-V_{in})>V_{ref}/4$, $D_{out}=+1$ and $V\_OUT=2*(V_{ip}-V_{in})+V_{ref}$. If $-V_{ref}/4 \le (V_{ip}-V_{in}) V_{ref}/4$, $D_{out}=0$ and $V\_OUT=2*(V_{ip}-V_{in})$. When $(V_{ip}-V_{in})<-V_{ref}/4$, $D_{out}=-1$ and $V\_OUT=2*(V_{ip}-V_{in})-V_{ref}$. Further details of the proposed MDAC 200 with pre-sampling are described as below.

As mentioned above, an operation of the DAC-subtract-gain function performed by the MDAC 200 is divided into a sampling cycle and a conversion cycle following the sampling cycle. For example, the sampling cycle is enabled by a first clock, and the conversion cycle is enabled by a second clock, where the first clock and the second clock are non-overlapping clocks, and on/off statuses of switches may be controlled by the first clock and the second clock. The switch SW1 has one node coupled to a pre-defined voltage (e.g., a bias voltage $V_{bias}$ of the operational amplifier OPAMP) and another node coupled to one plate of each of pre-sampling capacitors $C_{ps1}$, $C_{ps0}$, $C_{ps-1}$. In this embodiment, $V_{pd}=V_{bias}$. The switch SW'1 has one node coupled to the pre-defined voltage (e.g., bias voltage $V_{bias}$ of the operational amplifier OPAMP) and another node coupled to one plate of each of pre-sampling capacitors $C'_{ps1}$, $C'_{ps0}$, $C'_{ps-1}$. The switch SW5 has one node coupled to the non-inverting input node (+) of the operational amplifier OPAMP and another node coupled to one plate of each of pre-sampling capacitors $C_{ps1}$, $C_{ps0}$, $C_{ps-1}$. The switch SW'1 has one node coupled to the inverting input node (−) of the operational amplifier OPAMP and another node coupled to one plate of each of pre-sampling capacitors $C'_{ps1}$, $C'_{ps0}$, $C'_{ps-1}$. The switch SW9 has one node coupled to the inverting output node (−) of the operational amplifier OPAMP and another node coupled to one plate of the sampling capacitor $C_{sam}$. The switch SW'9 has one node coupled to the non-inverting output node (+) of the operational amplifier OPAMP and another node coupled to one plate of the sampling capacitor $C'_{sam}$.

The switch SW2 has one node coupled to the reference voltage $V_{refp}$, and another node coupled to another plate of the pre-sampling capacitor $C_{ps1}$. The switch SW'2 has one node coupled to the reference voltage $V_{refn}$, and another node coupled to another plate of the pre-sampling capacitor $C'_{ps1}$. The switch SW3 has one node coupled to the reference voltage $V_{cm}$, and another node coupled to another plate of the pre-sampling capacitor $C_{ps0}$. The switch SW'3 has one node coupled to the reference voltage $V_{cm}$, and another node coupled to another plate of the pre-sampling capacitor $C'_{ps0}$. The switch SW4 has one node coupled to the reference voltage $V_{refn}$, and another node coupled to another plate of the pre-sampling capacitor $C_{ps-1}$. The switch SW'4 has one node coupled to the reference voltage $V_{refp}$, and another node coupled to another plate of the pre-sampling capacitor $C'_{ps-1}$. When the pair of pre-sampling capacitors $C_{ps1}$ and $C'_{ps1}$ is selected for providing a pre-sampled reference voltage $V_{ref}$ according to a quantization result of the voltage input, the pair of pre-sampling capacitors $C_{ps0}$ and $C'_{ps0}$ and the pair of pre-sampling capacitors $C_{ps-1}$ and $C'_{ps-1}$ are not selected.

The switch SW6 has one node coupled to another plate of the pre-sampling capacitor $C_{ps1}$ and another node coupled to another plate of the sampling capacitor $C_{sam}$. The switch SW7 has one node coupled to another plate of the pre-sampling capacitor $C_{ps0}$ and another node coupled to another plate of the sampling capacitor $C_{sam}$. The switch SW8 has one node coupled to another plate of the pre-sampling capacitor $C_{ps-1}$ and another node coupled to another plate of the sampling capacitor $C_{sam}$. The switch SW'6 has one node coupled to another plate of the pre-sampling capacitor $C'_{ps1}$ and another node coupled to another plate of the sampling capacitor $C'_{sam}$. The switch SW'7 has one node coupled to another plate of the pre-sampling capacitor $C'_{ps0}$ and another node coupled to another plate of the sampling capacitor $C'_{sam}$. The switch SW'8 has one node coupled to another plate of the pre-sampling capacitor $C'_{ps-1}$ and another node coupled to another plate of the sampling capacitor $C'_{sam}$.

The switch SW10 has one node coupled to another plate of the sampling capacitor $C_{sam}$ and another node coupled to the negative signal $V_{in}$ of the differential voltage input. The switch SW11 has one node coupled to one plate of the sampling capacitor $C_{sam}$ and another node coupled to the positive signal $V_{ip}$ of the differential voltage input. The switch SW'10 has one node coupled to another plate of the sampling capacitor $C'_{sam}$ and another node coupled to the positive signal $V_{ip}$ of the differential voltage input. The switch SW'11 has one node coupled to one plate of the sampling capacitor $C'_{sam}$ and another node coupled to the negative signal $V_{in}$ of the differential voltage input.

Figure 5:
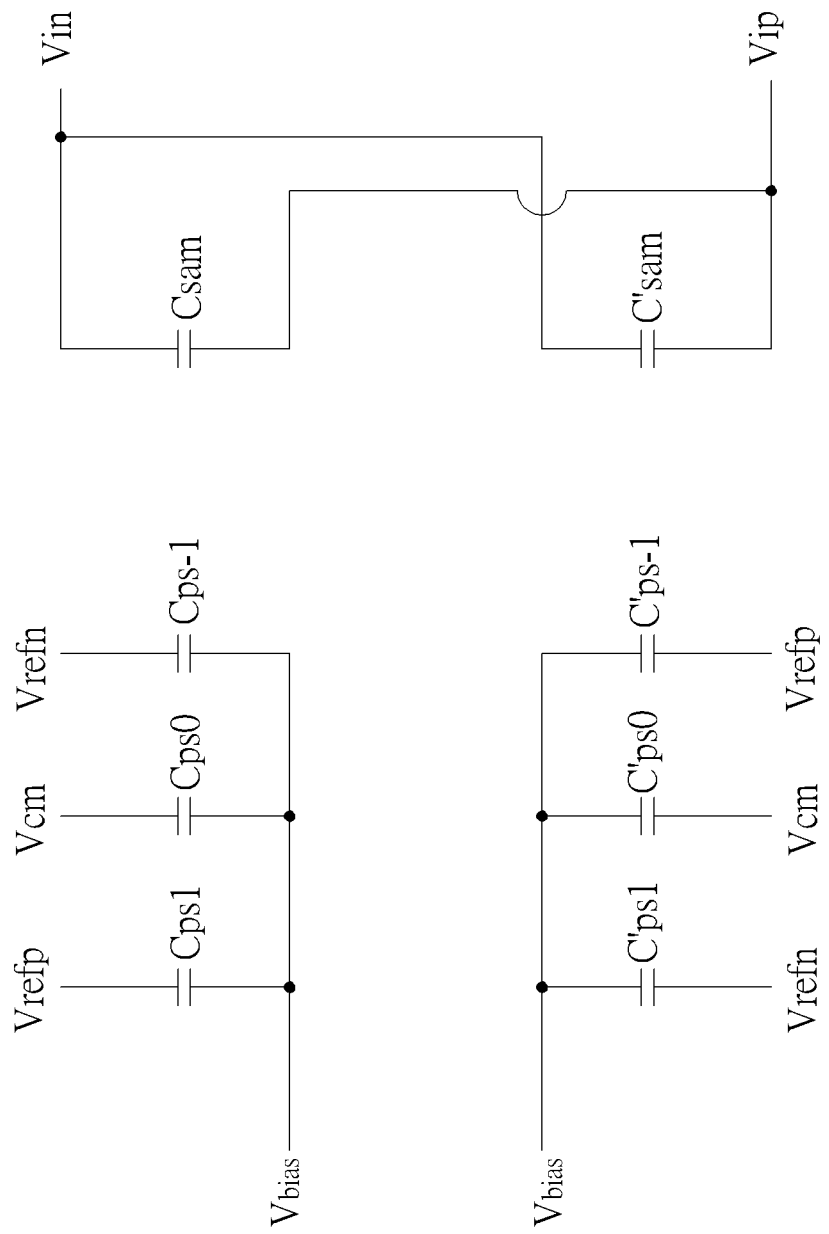
FIG. 5 is a diagram illustrating an equivalent circuit of the MDAC shown in FIG. 2 that operates during the sampling cycle.

During the sampling cycle, each of the switches SW1, SW2, SW3, SW4, SW10, SW11, SW'1, SW2', SW'3, SW'4, SW'10, SW'11 is switched on, and each of the switches SW5, SW6, SW7, SW8, SW9, SW'5, SW'6, SW'7, SW'8, SW'9 is switched off. FIG. 5 is a diagram illustrating an equivalent circuit of the MDAC 200 operating during the sampling cycle. The voltage difference ($V_{refp}-V_{bias}$) is held between two plates of the pre-sampling capacitor $C_{ps1}$. The voltage difference ($V_{cm}-V_{bias}$) is held between two plates of the pre-sampling capacitor $C_{ps0}$. The voltage difference ($V_{refn}-V_{bias}$) is held between two plates of the pre-sampling capacitor $C_{ps-1}$. The voltage difference ($V_{refn}-V_{bias}$) is held between two plates of the pre-sampling capacitor $C'_{ps1}$. The voltage difference ($V_{cm}-V_{bias}$) is held between two plates of the pre-sampling capacitor $C_{ps0}$. The voltage difference ($V_{refp}-V_{bias}$) is held between two plates of the pre-sampling capacitor $C'_{ps-1}$. The voltage difference ($V_{in}-V_{ip}$) is held between two plates of the sampling capacitor $C_{sam}$. The voltage difference ($V_{ip}-V_{in}$) is held between two plates of the sampling capacitor $C'_{sam}$.

During the conversion cycle, each of the switches SW1, SW2, SW3, SW4, SW10, SW11, SW'1, SW2', SW'3, SW'4, SW'10, SW'11 is switched off, and each of the switches SW5, SW9, SW'5, SW'9 is switched on. Regarding each of switches SW6, SW7, SW8, SW'6, SW'7, SW'8, it is selectively switched on in response to the quantization result of the voltage input ($V_{ip}-V_{in}$). When the pair of pre-sampling capacitors $C_{ps1}$ and $C'_{ps1}$ is selected for providing the pre-sampled reference voltage $V_{ref}$ (i.e., $V_{refp}-V_{refn}$) according to the quantization result of the voltage input ($V_{ip}-V_{in}$), the pair of pre-sampling capacitors $C_{ps0}$ and $C'_{ps0}$ and the pair of pre-sampling capacitors $C_{ps-1}$ and $C'_{ps-1}$ are not selected. When the pair of pre-sampling capacitors $C_{ps0}$ and $C_{ps0}$ is selected for providing the pre-sampled reference voltage 0V (i.e., $V_{cm}-V_{cm}$) according to the quantization result of the voltage input ($V_{ip}-V_{in}$), the pair of pre-sampling capacitors $C_{ps1}$ and $C'_{ps1}$ and the pair of pre-sampling capacitors $C_{ps-1}$ and $C'_{ps-1}$ are not selected. When the pair of pre-sampling capacitors $C_{ps-1}$ and $C'_{ps-1}$ is selected for providing the pre-sampled reference voltage $-V_{ref}$ (i.e., $V_{refn}-V_{refp}$) according to the quantization result of the voltage input ($V_{ip}-V_{in}$), the pair of pre-sampling capacitors $C_{ps0}$ and $C_{ps0}$ and the pair of pre-sampling capacitors $C_{ps1}$ and $C'_{ps1}$ are not selected.

Figure 6:
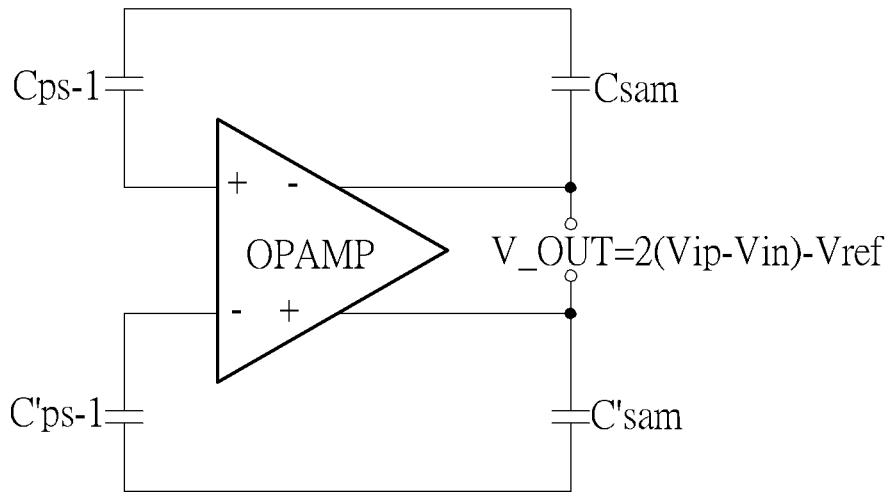
FIG. 6 is a diagram illustrating an equivalent circuit of the MDAC shown in FIG. 2 that operates under a condition of $(V_{ip}-V_{in})>V_{ref}/4$ during the conversion cycle.

For example, when ($V_{ip}-V_{in}$) is larger than $V_{ref}/4$, the quantization result of the voltage input ($V_{ip}-V_{in}$) may generate a 2-bit digital output "11", and a decision circuit may refer to the quantization result to switch on the switches SW8 and SW'8 and switch off the switches SW6, SW6', SW7, and SW'7. FIG. 6 is a diagram illustrating an equivalent circuit of the MDAC 200 under a condition of ($V_{ip}-V_{in}$)>$V_{ref}/4$ during the conversion cycle. As shown in FIG. 6, the pre-sampling capacitor $C_{ps-1}$ and the sampling capacitor $C_{sam}$ are connected in series, and the pre-sampling capacitor $C'_{ps-1}$ and the sampling capacitor $C'_{sam}$ are connected in series, where one plate of the pre-sampling capacitor $C_{ps-1}$ is connected to a virtual ground (floating ground) of the operational amplifier OPAMP, and one plate of the pre-sampling capacitor $C'_{ps-1}$ is connected to a virtual ground (floating ground) of the operational amplifier OPAMP. The voltage difference between the inverting output node (−) and the non-inverting input node (+) of the operational amplifier OPAMP is equal to ($V_{ip}-V_{in}$)+($V_{refn}-V_{bias}$). The voltage difference between the non-inverting output node (+) and the inverting input node (−) of the operational amplifier OPAMP is equal to ($V_{in}-V_{ip}$)($V_{refp}-V_{bias}$). Hence, the voltage output V_OUT can be expressed as follows:

$$V\_OUT=(V_{ip}-V_{in})+(V_{refn}-V_{bias})-[(V_{in}-V_{ip})(V_{refp}-V_{bias})]=2*(V_{ip}-V_{in})+(V_{refn}-V_{refp})=2*(V_{ip}-V_{in})-V_{ref}$$

Figure 7:
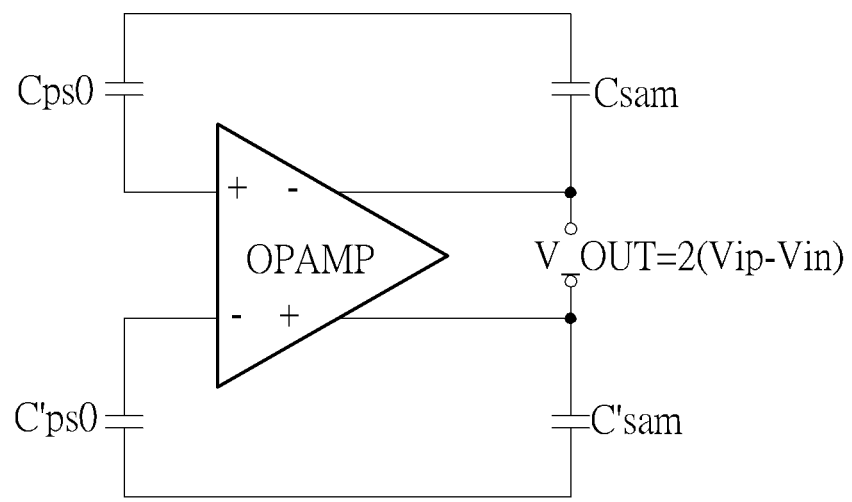
FIG. 7 is a diagram illustrating an equivalent circuit of the MDAC shown in FIG. 2 that operates under a condition of $-V_{ref}/4\leq(V_{ip}-V_{in})\leq V_{ref}/4$ during the conversion cycle.

For another example, when ($V_{ip}-V_{in}$) is not larger than $V_{ref}/4$ and is not smaller than $-V_{ref}/4$, the quantization result of the voltage input ($V_{ip}-V_{in}$) may generate a 2-bit digital output "01", and a decision circuit may refer to the quantization result to switch on the switches SW7 and SW'7 and switch off the switches SW6, SW6', SW8, and SW'8. FIG. 7 is a diagram illustrating an equivalent circuit of the MDAC 200 operating under a condition of $-V_{ref}/4 \leq (V_{ip}-V_{in}) \leq V_{ref}/4$ during the conversion cycle. As shown in FIG. 7, the pre-sampling capacitor $C_{ps0}$ and the sampling capacitor $C_{sam}$ are connected in series, and the pre-sampling capacitor $C_{ps0}$ and the sampling capacitor $C'_{sam}$ are connected in series, where one plate of the pre-sampling capacitor $C_{ps0}$ is connected to a virtual ground (floating ground) of the operational amplifier OPAMP, and one plate of the pre-sampling capacitor $C_{ps0}$ is connected to a virtual ground (floating ground) of the operational amplifier OPAMP. The voltage difference between the inverting output node (−) and the non-inverting input node (+) of the operational amplifier OPAMP is equal to ($V_{ip}-V_{in}$)+($V_{cm}-V_{bias}$). The voltage difference between the non-inverting output node (+) and the inverting input node (−) of the operational amplifier OPAMP is equal to ($V_{in}-V_{ip}$)+($V_{cm}-V_{bias}$). Hence, the voltage output V_OUT can be expressed as follows:

$$V\_OUT=(V_{ip}-V_{in})+(V_{cm}-V_{bias})-[(V_{in}-V_{ip})\pm(V_{cm}-V_{bias})]=2*(V_{ip}-V_{in})$$

Figure 8:
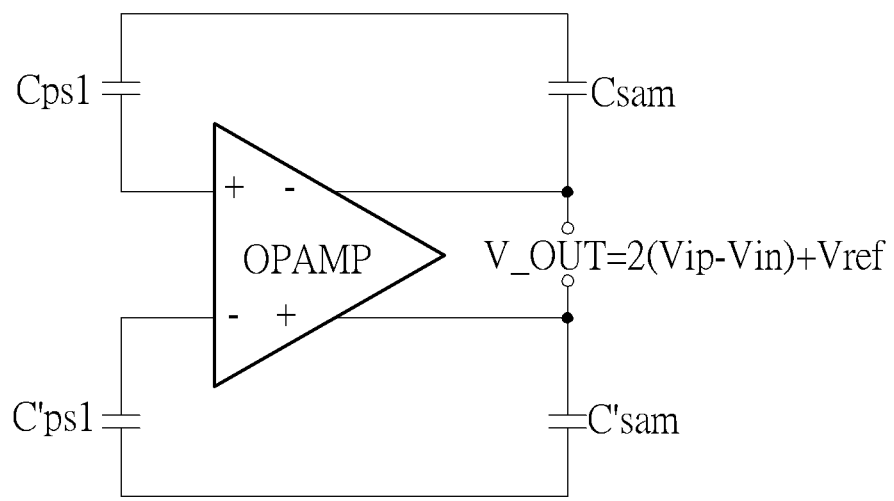
FIG. 8 is a diagram illustrating an equivalent circuit of the MDAC shown in FIG. 2 that operates under a condition of $-V_{ref}/4<(V_{ip}-V_{in})$ during the conversion cycle.

For yet another example, when ($V_{ip}-V_{in}$) is smaller than $-V_{ref}/4$, the quantization result of the voltage input ($V_{ip}-V_{in}$) may generate a 2-bit digital output "00", and a decision circuit may refer to the quantization result to switch on the switches SW6 and SW'6 and switch off the switches SW7, SW7', SW8, and SW'8. FIG. 8 is a diagram illustrating an equivalent circuit of the MDAC 200 operating under a condition of $-V_{ref}/4 < (V_{ip}-V_{in})$ during the conversion cycle. As shown in FIG. 8, the pre-sampling capacitor $C_{ps1}$ and the sampling capacitor $C_{sam}$ are connected in series, and the pre-sampling capacitor $C'_{ps1}$ and the sampling capacitor $C'_{sam}$ are connected in series, where one plate of the pre-sampling capacitor $C_{ps1}$ is connected to a virtual ground (floating ground) of the operational amplifier OPAMP, and one plate of the pre-sampling capacitor $C'_{ps1}$ is connected to a virtual ground (floating ground) of the operational amplifier OPAMP. The voltage difference between the inverting output node (−) and the non-inverting input node (+) of the operational amplifier OPAMP is equal to ($V_{ip}-V_{in}$)+($V_{refp}-V_{bias}$). The voltage difference between the non-inverting output node (+) and the inverting input node (−) of the operational amplifier OPAMP is equal to ($V_{in}-V_{ip}$)+($V_{refn}-V_{bias}$). Hence, the voltage output V_OUT can be expressed as follows:

$$V\_OUT=(V_{ip}-V_{in})(V_{refp}-V_{bias})(V_{in}-V_{ip})+(V_{refn}-V_{bias})=2*(V_{ip}-V_{in})+(V_{refp}-V_{refn})=2*(V_{ip}-V_{in})+V_{ref}$$

Since one plate of the selected pre-sampling capacitor that receives $V_{bias}$ during the sampling cycle is floated during the conversion cycle, the operational amplifier OPAMP does not need to consume power for driving any capacitive load, and thus has power relaxation during the conversion cycle. In addition, as can be seen from FIGS. 6-8, the voltage output V_OUT is derived from combining the voltage across the selected pre-sampling capacitor and the voltage across the sampling capacitor. Hence, the operational amplifier OPAMP has a feedback factor (β) that is equal to 1. Compared to an operational amplifier with β<1, the operational amplifier OPAMP can have a wider bandwidth or lower power consumption. Moreover, since there is no charge flowing between a selected pre-charging capacitor $C_{ps1}/C_{ps0}/C_{ps-1}/C'_{ps1}/C'_{ps0}/C'_{ps-1}$ and a sampling capacitor $C_{sam}/C'_{sam}$ during the conversion cycle, there is no voltage change at one plate of the selected pre-charging capacitor $C_{ps1}/C_{ps0}/C_{ps-1}/C'_{ps1}/C'_{ps0}/C'_{ps-1}$ that receives a reference voltage $V_{refp}/V_{cm}/V_{refn}$ supplied from an external reference buffer. Since no additional power is consumed by the reference buffer to maintain the reference voltage $V_{refp}/V_{cm}/V_{refn}$ during the conversion cycle, power relaxation of the reference buffer is achieved.

Figure 9:
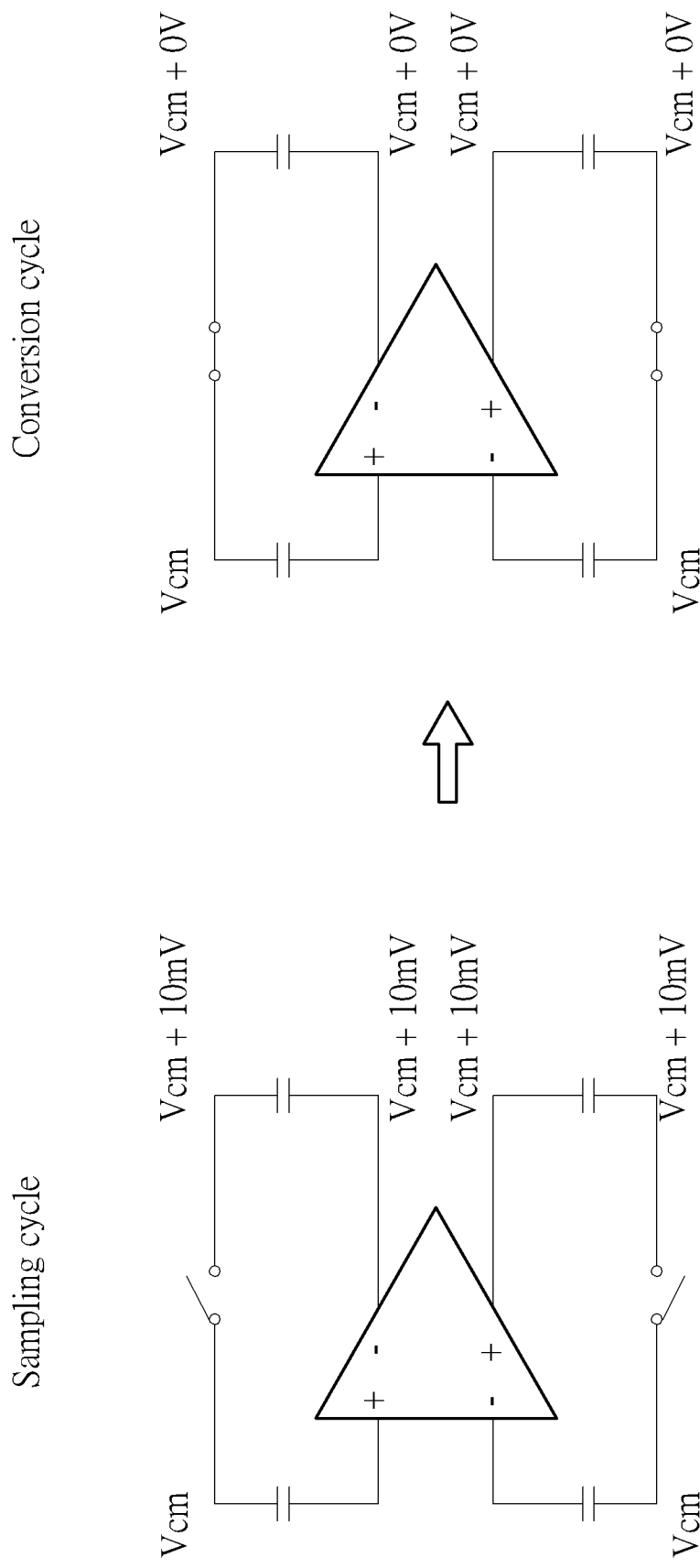
FIG. 9 is a diagram illustrating common-mode suppression achieved by the proposed MDAC with pre-sampling according to an embodiment of the present invention.

As mentioned above, the voltage output V_OUT is derived from combining the voltage across the selected pre-sampling capacitor and the voltage across the sampling capacitor, where one plate of the selected pre-charging capacitor receives a reference voltage supplied from an external reference buffer. The output common-mode voltage is not determined by the input common-mode voltage. Hence, the input common-mode offset can be suppressed by the proposed MDAC 200 with pre-sampling. FIG. 9 is a diagram illustrating common-mode suppression achieved by the proposed MDAC 200 with pre-sampling according to an embodiment of the present invention. Suppose that the positive signal $V_{ip}$ of the differential voltage input has a common-mode offset (e.g., 10 mV), and the negative signal $V_{in}$ of the differential voltage input also has a common-mode offset (e.g., 10 mV). During the sampling cycle, a fixed common-mode voltage is presented at the pre-sampling capacitor. During the conversion cycle, the pre-sampling capacitor and the sampling capacitor are connected in series, where the voltage across the series-connected pre-sampling capacitor and the sampling capacitor is equal to a summation of the voltage across the pre-sampling capacitor and the voltage across the sampling capacitor. Hence, the output common-mode voltage is determined by the fixed common-mode voltage provided by the pre-sampling capacitor, regardless of the input common-mode offset (e.g., 10 mV).

Figure 10:
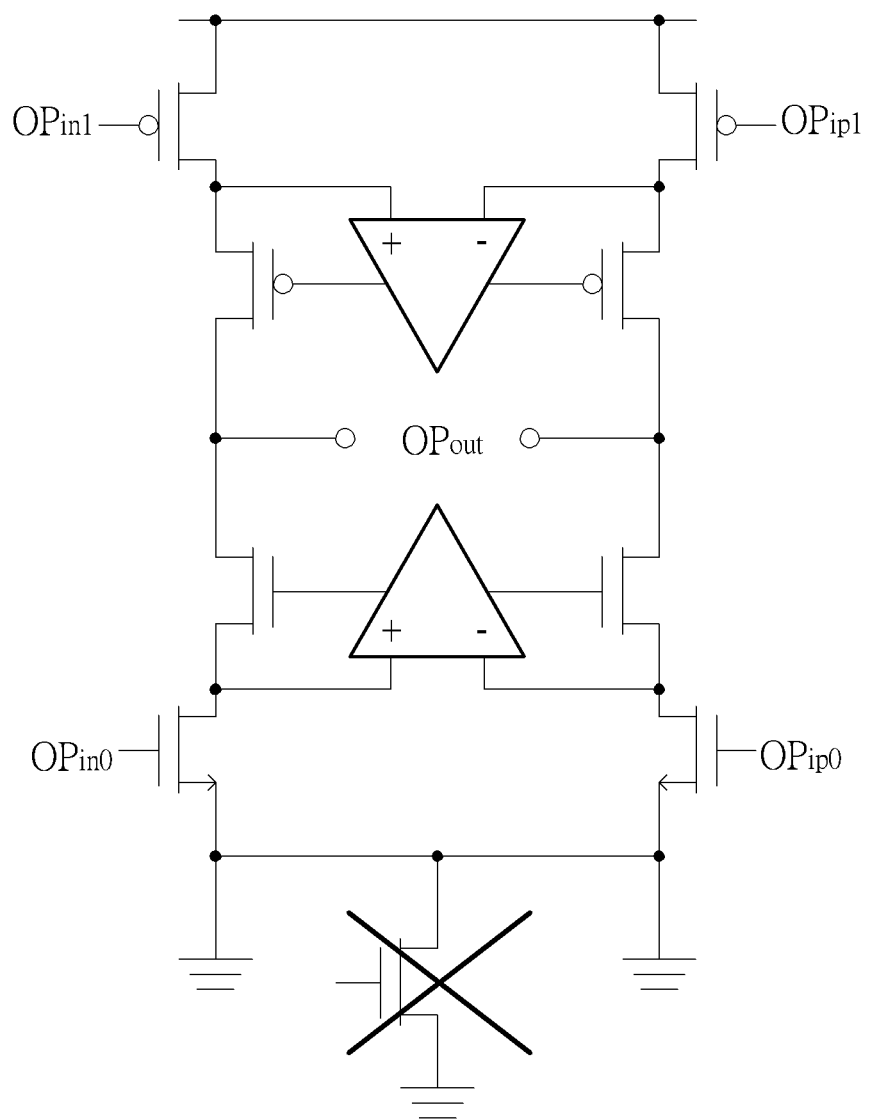
FIG. 10 is a diagram illustrating a differential amplifier without a tail current source according to an embodiment of the present invention.

A conventional differential amplifier may provide a tail current source as an effective technique for resolving problems associated with common-mode offset. However, the conventional differential amplifier with the tail current source generally sacrifices speed for resolving problems associated with common-mode offset. Since the input common-mode offset is suppressed by the proposed MDAC 200 with pre-sampling, the operational amplifier OPAMP may be implemented by a differential amplifier without a tail current source, as illustrated in FIG. 10. For example, the operational amplifier OPAMP may be a telescopic differential amplifier without a tail current source. Since no tail current source is used by the operational amplifier OPAMP, the output current is no longer bounded by the tail current source. In this way, the operational amplifier OPAMP can operate at higher speed for setting the differential amplifier output (e.g., $OP_{out}$ generated from the telescopic differential amplifier shown in FIG. 10) according to the differential amplifier input {e.g., $OP_{in1}$, $OP_{ip1}$} and {$OP_{in0}$, $OP_{ip0}$} received by the telescopic differential amplifier shown in FIG. 10). Moreover, since the input common-mode offset can be suppressed by the proposed MDAC 200 with pre-sampling, the common-mode feedback circuit can be omitted from the operational amplifier OPAMP.

Compared to a conventional MDAC without pre-sampling, the proposed MDAC 200 with pre-sampling selects one of $-V_{ref}$, 0V, and $V_{ref}$ via pre-sampling capacitor selection, achieves 2X voltage amplification by sampling the voltage input at the sampling capacitor only, has the same kT/C noise performance with the use of smaller sampling capacitor, uses an operational amplifier that has β=1, lower finite gain error and lower power consumption, and can use an operational amplifier with no tail current source, and achieves power relaxation of a reference buffer that is used to provide reference voltages $V_{refp}$, $V_{cm}$, and $V_{refn}$. Furthermore, since the voltage output V_OUT is derived from combining the voltage across the selected pre-sampling capacitor and the voltage across the sampling capacitor, no background calibration is needed by the proposed MDAC 200 with pre-sampling.

Compared to a multi-stage operational amplifier, a single-stage operational amplifier has lower power consumption and smaller output swing. When the operational amplifier OPAMP is implemented by a single-stage operational amplifier, the MDAC 200 with pre-sampling can benefit from the low power consumption of the operational amplifier OPAMP. As mentioned above, the input common-mode offset can be suppressed by the proposed MDAC 200 with pre-sampling, and the operational amplifier OPAMP may be implemented by a differential amplifier without a tail current source. The operational amplifier OPAMP employed by the proposed MDAC 200 with pre-sampling may be a single-stage differential amplifier with no tail current source. Since the tail current source that affects the output swing is removed, single-stage differential amplifier with no tail current source can provide the output swing required by the proposed MDAC 200 with pre-sampling.

In some embodiments of the present invention, a correlated-level-shifting (CLS)-assisted operational amplifier may be used in an MDAC with pre-sampling to address the output swing issue encountered by the single-stage operational amplifier. It should be noted that using a CLS-assisted operational amplifier with/without tail current in an MDAC with pre-sampling is optional. In practice, any MDAC design using the proposed pre-sampling technique falls within the scope of the present invention.

Figure 11:
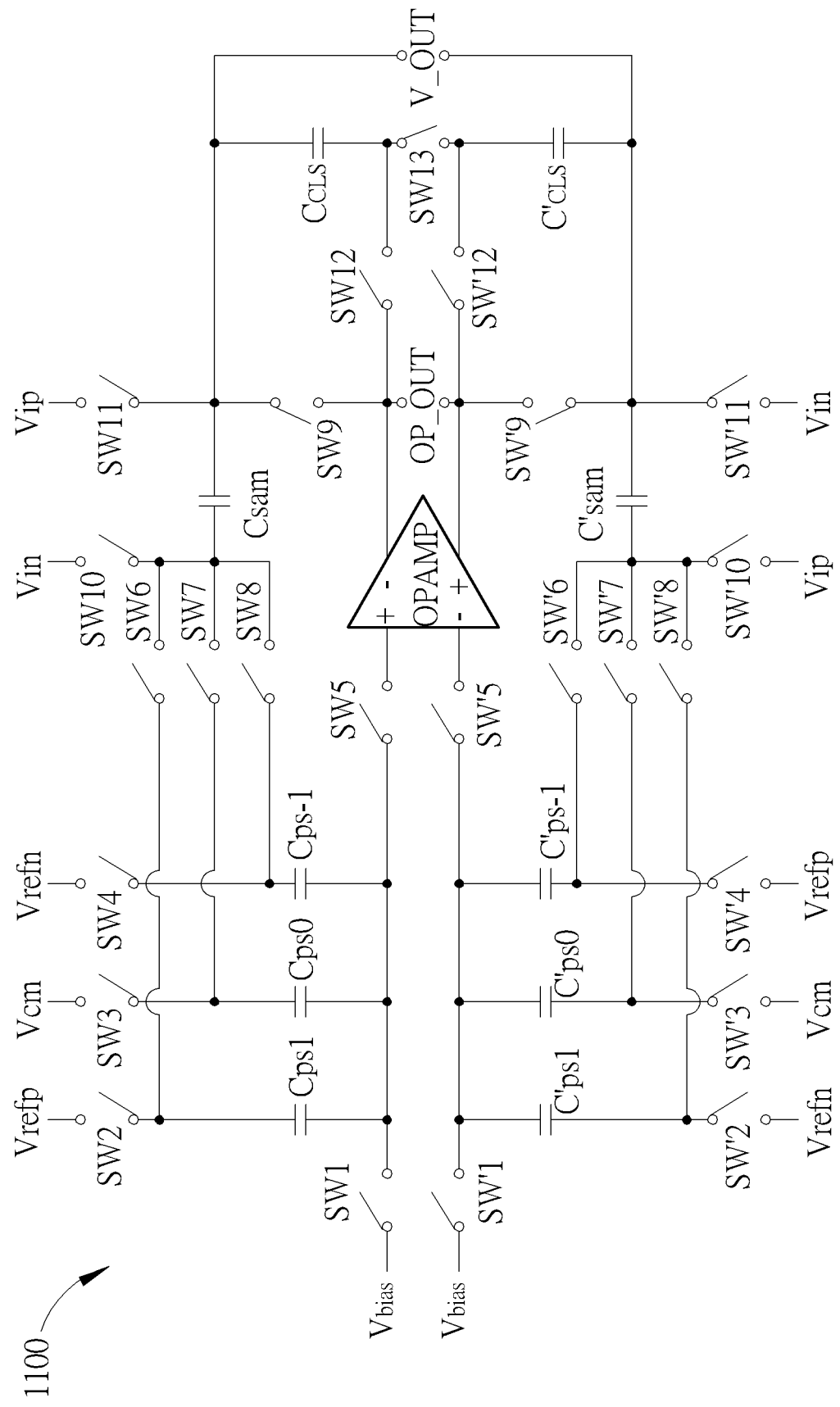
FIG. 11 is a circuit diagram of an MDAC with pre-sampling and CLS-assisted operational amplifier according to an embodiment of the present invention.

FIG. 11 is a circuit diagram of an MDAC with pre-sampling and CLS-assisted operational amplifier according to an embodiment of the present invention. The MDAC 100 shown in FIG. 1 may be implemented by the MDAC 1100 shown in FIG. 11. In this embodiment, the operational amplifier OPAMP may be implemented by a single-stage differential amplifier with a tail current source or a single-stage differential amplifier without a tail current source. The major difference between the MDACs 200 and 1100 is that the MDAC 1100 further includes a plurality of CLS capacitors $C_{CLS}$, $C'_{CLS}$ and a plurality of switches SW12, SW'12, SW13. One plate of the CLS capacitor $C_{CLS}$ is coupled to one plate of the sampling capacitor $C_{sam}$. One plate of the CLS capacitor $C'_{CLS}$ is coupled to one plate of the sampling capacitor $C'_{sam}$. The switch SW13 is a reset switch having one node coupled to another plate of the CLS capacitor $C_{CLS}$ and another node coupled to another plate of the CLS capacitor $C_{CLS}$. The switch SW12 has one node coupled to the inverting output node (−) of the operational amplifier OPAMP and another node coupled to one node of the switch SW13. The switch SW' 12 has one node coupled to the non-inverting output node (+) of the operational amplifier OPAMP and another node coupled to another node of the switch SW13.

During the sampling cycle, each of the switches SW1, SW2, SW3, SW4, SW10, SW11, SW'1, SW2', SW'3, SW'4, SW10, SW'11 is switched on, and each of the switches SW5, SW6, SW7, SW8, SW9, SW12, SW13, SW'5, SW'6, SW'7, SW'8, SW'9, SW'12 is switched off. During the conversion cycle, each of the switches SW1, SW2, SW3, SW4, SW10, SW11, SW'1, SW2', SW'3, SW'4, SW10, SW'11 is switched off, and each of the switches SW5, SW'5, SW9, SW'9 is switched on. Regarding each of switches SW6, SW7, SW8, SW'6, SW'7, and SW'8, it is selectively switched on in response to the quantization result of the voltage input ($V_{ip}$–$V_{in}$). Since the MDACs 200 and 1100 have the same control of the above switches during the sampling cycle and the conversion cycle, further description is omitted here for brevity.

Figure 12:
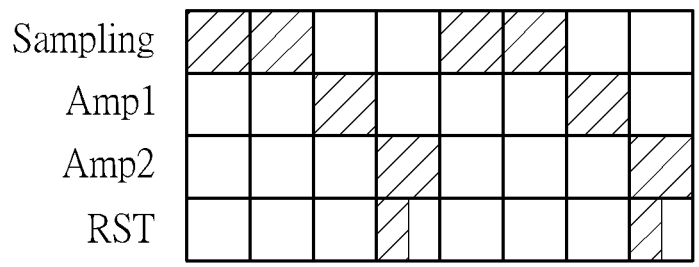
FIG. 12 is a diagram illustrating an operation of the DAC-subtract-gain function performed by the MDAC shown in FIG. 11 that includes a sampling cycle, a first phase of a conversion cycle, and a second phase of the conversion cycle, where the second phase includes a reset (RST) operation.

Compared to the MDAC 200 with an amplifier output directly acting as the MDAC output (i.e., V_OUT), the MDAC 1100 does not use an amplifier output OP OUT as the MDAC output (i.e., V_OUT). Specifically, the conversion cycle is divided into a first phase Amp1 and a second phase Amp2 following the first phase Amp1. In addition, the second phase Amp2 includes a starting period in which a reset (RST) operation occurs for quickly resetting the amplifier output OP OUT. FIG. 12 is a diagram illustrating an operation of the DAC-subtract-gain function performed by the MDAC 1100 includes a sampling cycle, a first phase Amp1 of a conversion cycle, and a second phase Amp2 of the conversion cycle, where the second phase Amp2 includes a reset (RST) operation.

Figure 13:
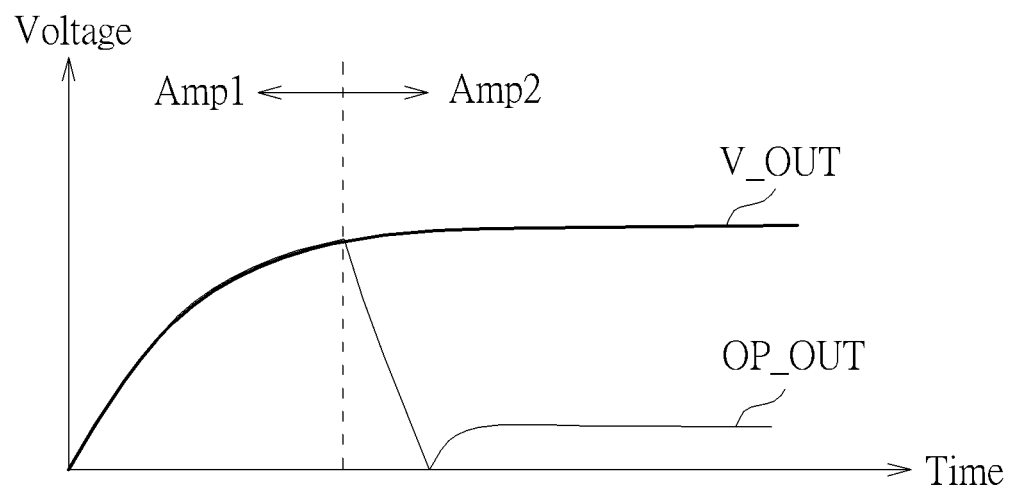
FIG. 13 is a diagram illustrating a voltage level of an amplifier output and a voltage level of an MDAC output during the conversion cycle of the MDAC shown in FIG. 11.
Figure 14:
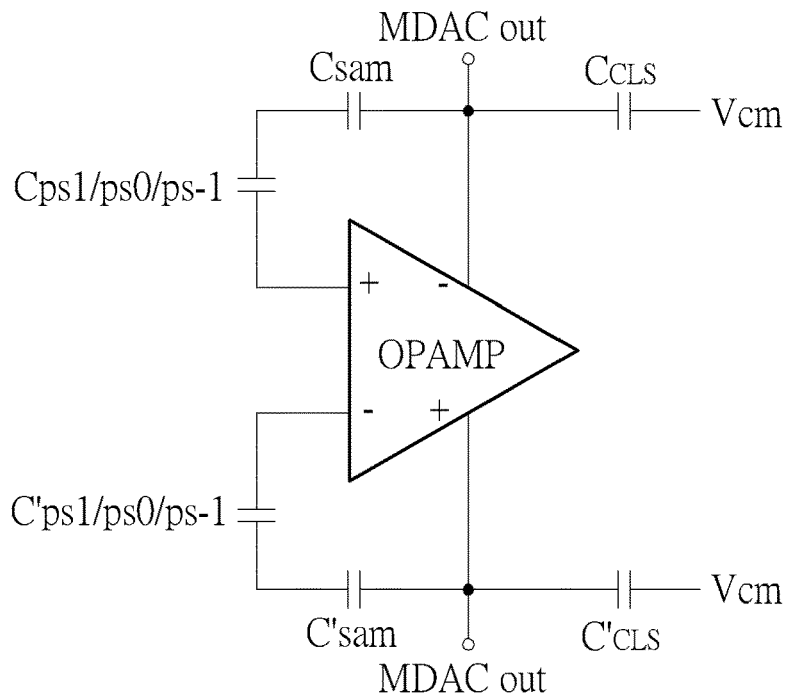
FIG. 14 is a diagram illustrating an equivalent circuit of the MDAC shown in FIG. 11 that operates during the first phase of the conversion cycle.

Please refer to FIG. 11 in conjunction with FIG. 13. FIG. 13 is a diagram illustrating a voltage level of an amplifier output OP OUT and a voltage level of an MDAC output (i.e., V_OUT) during the conversion cycle of the MDAC 1100. During the first phase Amp1 of the conversion cycle, each of the switches SW9 and SW'9 is switched on, and each of the switches SW12, SW'12, SW13 is switched off. FIG. 14 is a diagram illustrating an equivalent circuit of the MDAC 1100 operating during the first phase Amp1 of the conversion cycle. Since the MDAC output is coupled to the amplifier output via the switches SW9 and SW'9, the voltage level of the amplifier output OP OUT is substantially the same as the voltage level of the MDAC output (i.e., V_OUT), as shown in FIG. 13.

Figure 15:
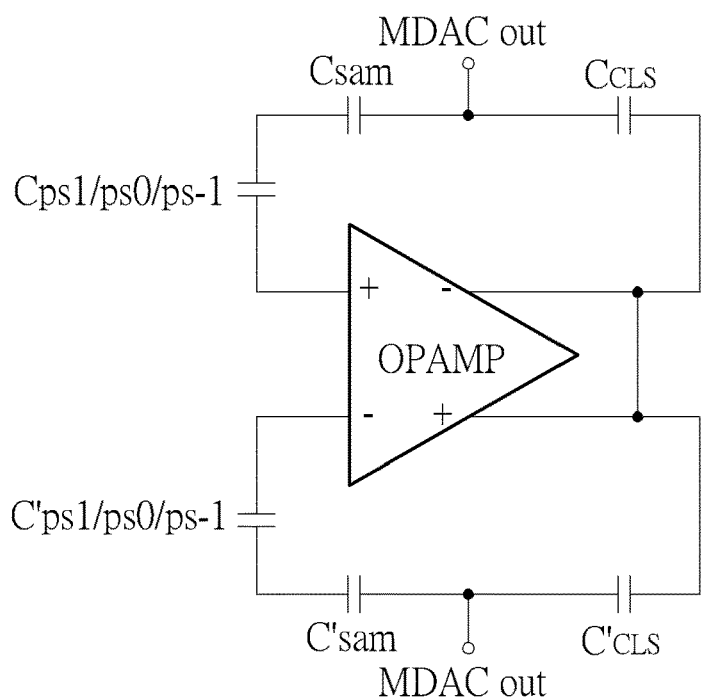
FIG. 15 is a diagram illustrating an equivalent circuit of the MDAC shown in FIG. 11 that operates during the starting period of the second phase of the conversion cycle.

During the starting period of the second phase Amp2 of the conversion cycle, each of the switches SW9 and SW'9 is switched off, and each of the switches SW12, SW'12, SW13 is switched on. FIG. 15 is a diagram illustrating an equivalent circuit of the MDAC 1100 operating during the starting period of the second phase Amp2 of the conversion cycle. As shown in FIG. 13, the voltage level of the MDAC output (i.e., V_OUT) is maintained by the CLS capacitors $C'_{CLS}$ and $C''_{CLS}$, while the voltage level of the amplifier output OP OUT is reset to the common-mode voltage (e.g., 0V).

Figure 16:
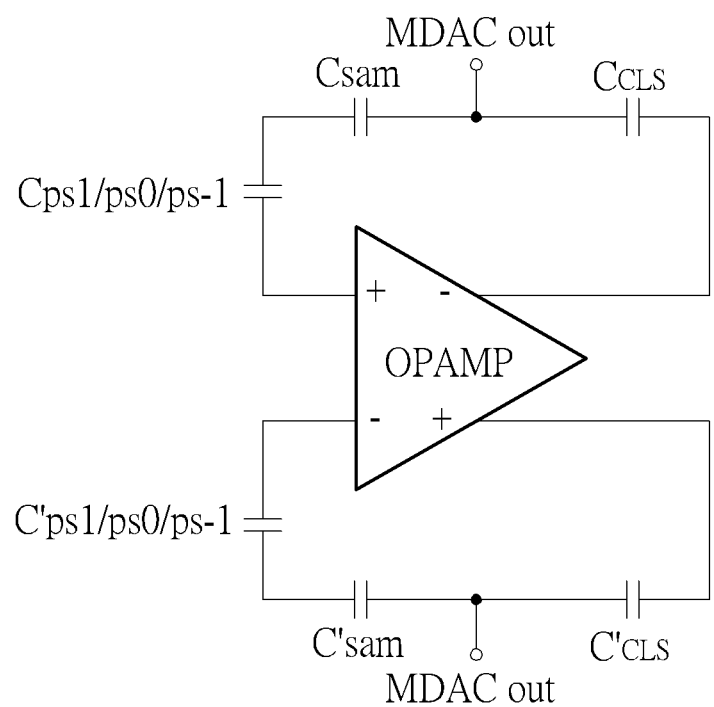
FIG. 16 is a diagram illustrating an equivalent circuit of the MDAC shown in FIG. 11 that operates during the remaining period of the second phase of the conversion cycle.

During the remaining period of the second phase Amp2 of the conversion cycle, each of the switches SW9, SW'9, SW13 is switched off, and each of the switches SW12, SW'12 is switched on. FIG. 16 is a diagram illustrating an equivalent circuit of the MDAC 1100 operating during the remaining period of the second phase Amp2 of the conversion cycle. As shown in FIG. 13, the operational amplifier OPAMP keeps adjusting the amplifier output OP OUT, such that the voltage level of the MDAC output (i.e., V_OUT) is further adjusted by the voltage level of the amplifier output OP OUT through capacitive coupling. As can be seen from FIG. 13, the amplification operation of the operational amplifier OPAMP is divided into two phases Amp1 and Amp2. The output swing needed by the operational amplifier OPAMP operating under the second phase Amp2 is reduced after the amplifier output OP OUT is reset. In this way, the MDAC output (i.e., V_OUT) with a larger swing can be successfully obtained by using a CLS-assisted single-stage amplifier with a smaller output swing. Moreover, with the help of the CLS capacitors and the two-step amplification, the finite gain error of the operational amplifier OPAMP (i.e., CLS-assisted single-stage amplifier) can be reduced greatly.

Figure 17:
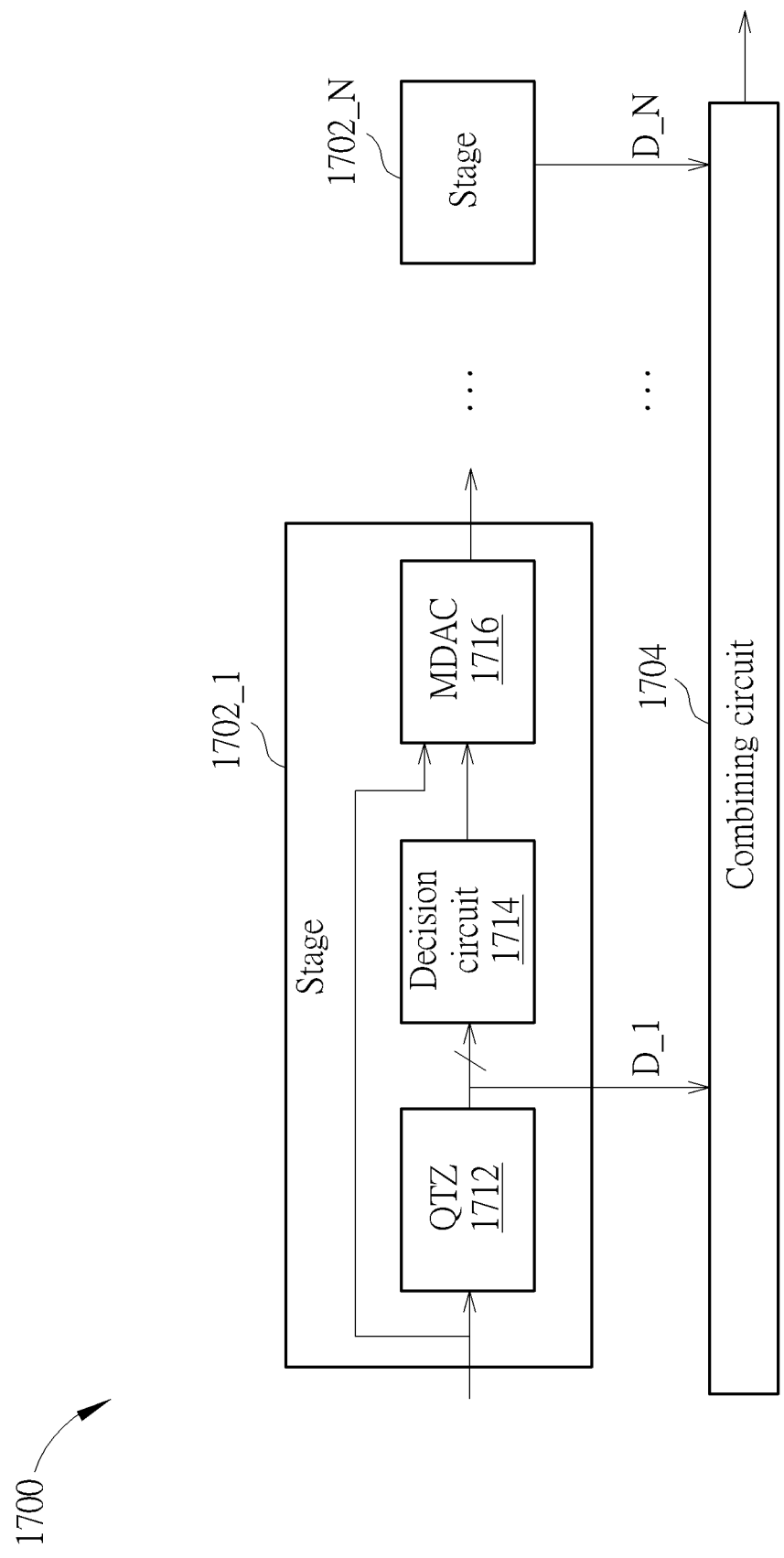
FIG. 17 is a diagram illustrating a pipelined ADC according to an embodiment of the present invention.

The proposed MDAC with pre-sampling (or proposed MDAC with pre-sampling and CLS-assisted operational amplifier) may be employed by an analog-to-digital converter (ADC), such as a pipelined ADC or a time-interleaved ADC using pipelined ADCs. FIG. 17 is a diagram illustrating a pipelined ADC according to an embodiment of the present invention. The pipelined ADC 1700 includes a plurality of stages 1702_1-1702_N and a combining circuit 1704. The stages 1702_1-1702_N are connected in a pipeline, and are arranged to generate a plurality of digital outputs D_1-D_N. The combining circuit 1704 is arranged to combine the digital outputs D_1-D_N to generate a final digital output. The stage 1702_N is a terminal ADC. For example, the terminal ADC may be implemented by a SAR ADC. In this embodiment, each of the stages 1702_1-1702_(N–1) may employ the proposed MDAC with pre-sampling (or proposed MDAC with pre-sampling and CLS-assisted operational amplifier). Taking the stage 1702_1 for example, it includes a quantization circuit (QTZ) 1712, a decision circuit 1714, and an MDAC 1716. The quantization circuit 1712 generates a quantization result of a voltage input of the stage 1702_1, where the digital output D_1 of the stage 1702_1 depends on the quantization result of the voltage input of the stage 1702_1. The MDAC 1716 may be implemented by the MDAC 200/1100. The decision circuit 1714 is arranged to select one of the pre-sampling capacitors $C_{ps1}$, $C_{ps0}$, $C_{ps-1}$ that will be series-connected to one sampling capacitor $C_{sam}$ during the conversion cycle, and further select one of the pre-sampling capacitors $C'_{ps1}$, $C'_{ps0}$, $C'_{ps-1}$ that will be series-connected to another sampling capacitor $C'_{sam}$ during the conversion cycle. For example, the decision circuit 1714 refers to the quantization result of the voltage input (e.g., digital output D_1) to determine $D_{out}*V_{ref}$ that will be combined with $2*(V_{ip}-V_{in})$, where $D_{out}$=+1 if $(V_{ip}-V_{in})<-V_{ref}/4$, $D_{out}$=0 if $-V_{ref}/4 \leq (V_{ip}-V_{in}) \leq V_{ref}/4$ and $D_{out}$=–1 if $(V_{ip}-V_{in})>V_{ref}/4$.

Figure 18:
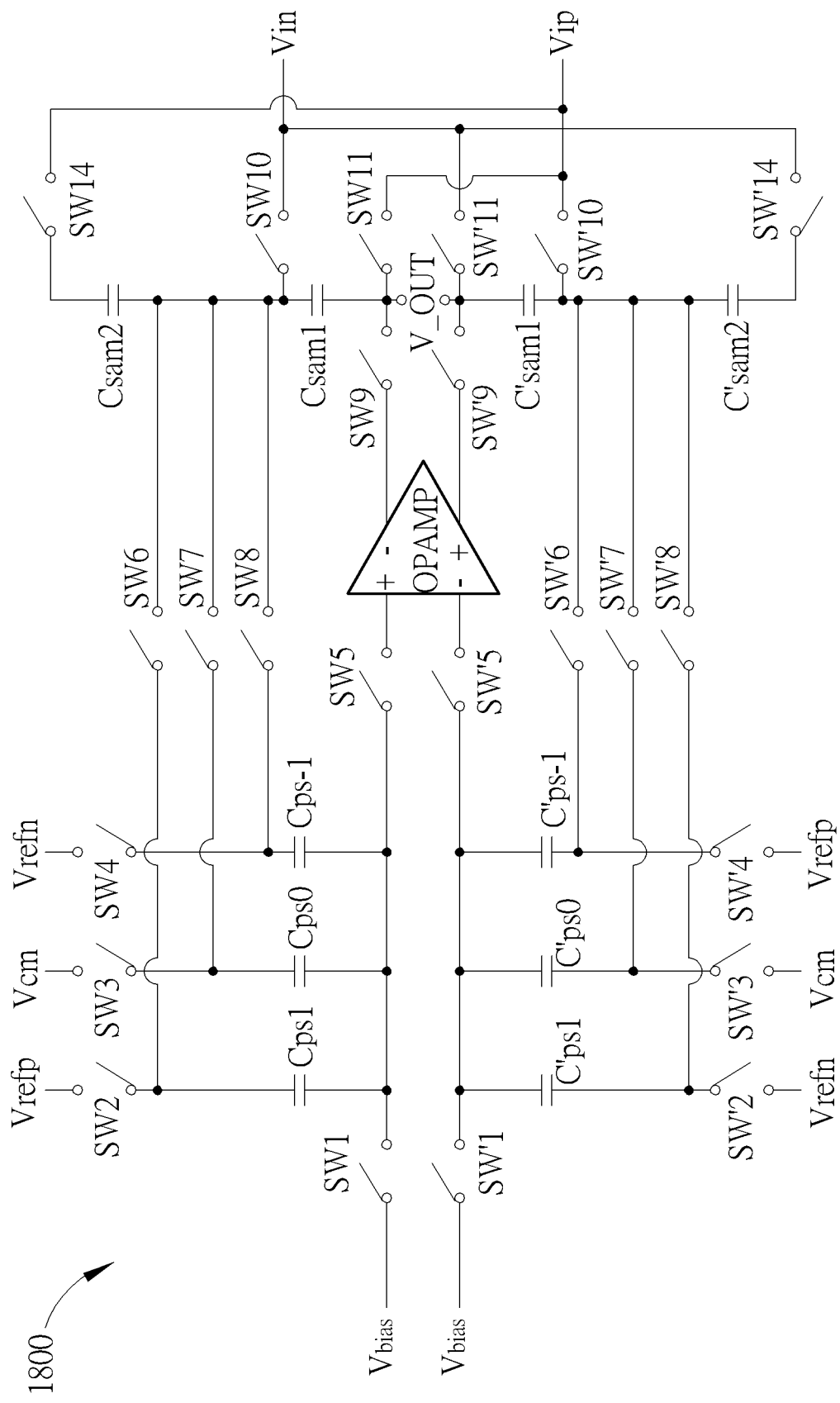
FIG. 18 is a circuit diagram illustrating another MDAC with pre-sampling according to an embodiment of the present invention.

Regarding the pipelined ADC 1700, one stage with an MDAC implemented by MDAC 200/1100 has a 1.5-bit/stage structure. However, this is for illustrative purposes only, and is not meant to be a limitation of the present invention. With proper modifications made to MDAC 200/1100, one stage with a modified MDAC may have a 2.5-bit/stage structure or a 3.5-bit/stage structure. FIG. 18 is a circuit diagram illustrating another MDAC with pre-sampling according to an embodiment of the present invention. Regarding the pipelined ADC 1700, one stage with an MDAC implemented by MDAC 1800 has a 2.5-bit/stage structure. The major difference between MDACs 200 and 1800 is that the MDAC 1800 includes four sampling capacitors $C_{sam1}$, $C_{sam2}$, $C'_{sam1}$, $C'_{sam2}$ and additional switches SW14 and SW'14. Each of the switches SW10, SW11, SW14, SW10', SW'11, SW'14 is switched on during the sampling cycle and is switched off during the conversion cycle. Since a person skilled in the pertinent art can readily understand details and benefits of the pre-sampling technique employed by MDAC 1800 after reading above paragraphs directed to MDAC 200, further description is omitted here for brevity.

Figure 19:
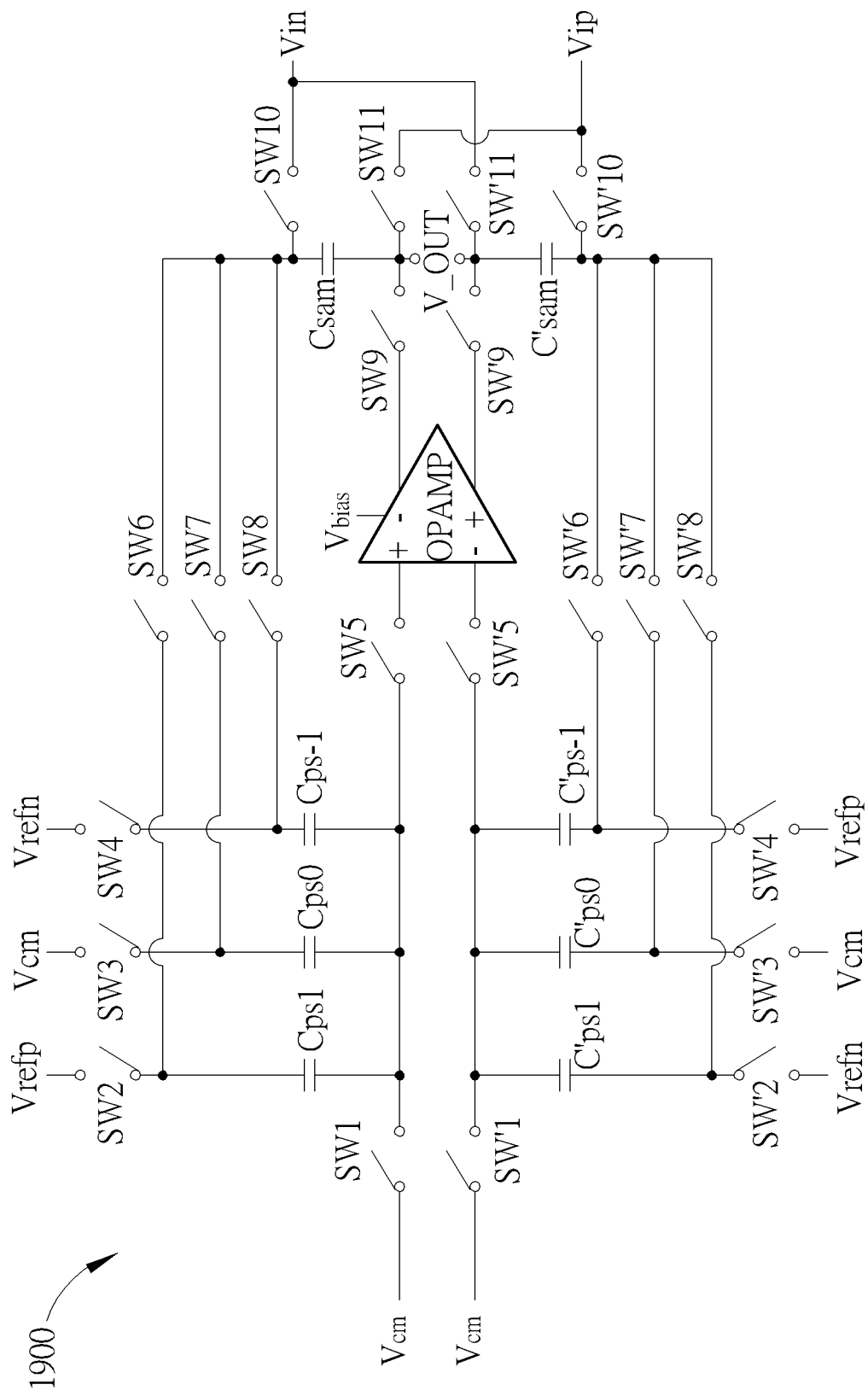
FIG. 19 is a circuit diagram of an MDAC with pre-sampling that utilizes a common-mode voltage as a pre-defined voltage according to an embodiment of the present invention.

In above embodiments shown in FIGS. 2, 11, and 18, the pre-defined voltage $V_{pd}$ is set by the bias voltage $V_{bias}$ of the operational amplifier OPAMP. However, these are for illustrative purposes only, and are not meant to be limitations of the present invention. Alternatively, the embodiments shown in FIGS. 2, 11, and 18 may be modified to have the pre-defined voltage $V_{pd}$ set by a different voltage such as a common-mode voltage (e.g., 0V). FIG. 19 is a circuit diagram of an MDAC with pre-sampling that utilizes a common-mode voltage as a pre-defined voltage according to an embodiment of the present invention. The major difference between the MDACs 200 and 1900 is that one node of the switch SW1 is arranged to receive the reference voltage $V_{CM}$, and one node of the switch SW'1 is arranged to receive the reference voltage $V_{CM}$, where the reference voltage $V_{CM}$ is a common-mode voltage (e.g., 0V).

In above embodiments shown in FIGS. 2, 11, and 18, an arrangement of switches SW1, SW'1, SW5, SW'5 controls that one plate of each of the pre-sampling capacitors $C_{ps1}$, $C_{ps0}$, $C_{ps-1}$, $C'_{ps1}$, $C'_{ps0}$, $C'_{ps-1}$ is connected to the pre-defined voltage (e.g., $V_{pd}=V_{bias}$) and is disconnected from the input port of the operational amplifier OPAMP during the sampling cycle, and controls that one plate of each of the pre-sampling capacitors $C_{ps1}$, $C_{ps0}$, $C_{ps-1}$, $C'_{ps0}$, $C'_{ps-1}$ is disconnected from the pre-defined voltage (e.g., $V_{pd}=V_{bias}$) and is connected to the input port of the operational amplifier OPAMP during the conversion cycle. However, these are for illustrative purposes only, and are not meant to be limitations of the present invention. Alternatively, the embodiments shown in FIGS. 2, 11, and 18 may be modified to have a different switch arrangement that can achieve the same objective of making one plate of each of the pre-sampling capacitors $C_{ps1}$, $C_{ps0}$, $C_{ps-1}$, $C'_{ps0}$, $C'_{ps-1}$ connected to the pre-defined voltage (e.g., $V_{pd}=V_{bias}$ or $V_{pd}=V_{cm}$) and disconnected from the input port of the operational amplifier OPAMP during the sampling cycle, and making one plate of each of the pre-sampling capacitors $C_{ps1}$, $C_{ps0}$ $C_{ps-1}$, $C'_{ps1}$, $C'_{ps0}$, $C_{ps-1}$ disconnected from the pre-defined voltage (e.g., $V_{pd}=V_{bias}$ or $V_{pd}=V_{cm}$) and connected to the input port of the operational amplifier OPAMP during the conversion cycle.

Figure 20:
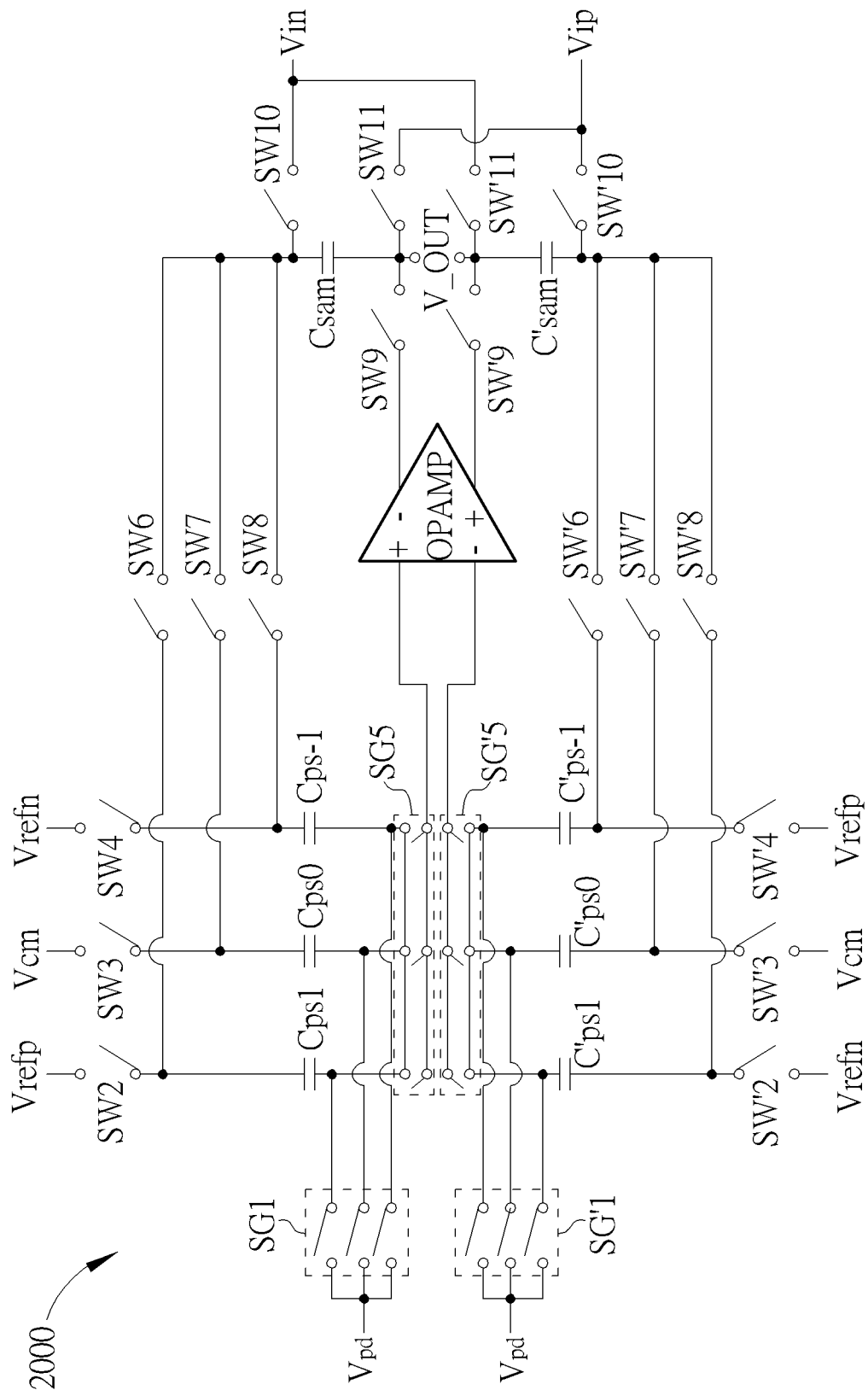
FIG. 20 is a circuit diagram of an MDAC with pre-sampling that utilizes a different switch arrangement according to an embodiment of the present invention.

FIG. 20 is a circuit diagram of an MDAC with pre-sampling that utilizes a different switch arrangement according to an embodiment of the present invention. The major difference between the MDACs 200 and 2000 is that the switch SW1 is replaced by a switch group SG1 consisting of multiple switches, the switch SW'1 is replaced by a switch group SG'1 consisting of multiple switches, the switch SW5 is replaced by a switch group SG5 consisting of multiple switches, and the switch SW'5 is replaced by a switch group SG'5 consisting of multiple switches.

The switch group SG1 has one switch with a first node coupled to the pre-defined voltage $V_{pd}$ (e.g., $V_{pd}V=_{bias}$ or $V_{pd}=V_{cm}$) and a second node coupled to one plate of the pre-sampling capacitor $C_{ps1}$, another switch with a first node coupled to the pre-defined voltage $V_{pd}$ (e.g., $V_{pd}=V_{bias}$ or $V_{pd}=V_{cm}$) and a second node coupled to one plate of the pre-sampling capacitor $C_{ps0}$, and yet another switch with a first node coupled to the pre-defined voltage $V_{pd}$ (e.g., $V_{pd}=V_{bias}$ or $V_{pd}=V_{cm}$) and a second node coupled to one plate of the pre-sampling capacitor $C_{ps-1}$.

The switch group SG' 1 has one switch with a first node coupled to the pre-defined voltage $V_{pd}$ (e.g., $V_{pd}=V_{bias}$ or $V_{pd}=V_{cm}$) and a second node coupled to one plate of the pre-sampling capacitor $C'_{ps1}$, another switch with a first node coupled to the pre-defined voltage $V_{pd}$ (e.g., $V_{pd}=V_{bias}$ or $V_{pd}=V_{cm}$) and a second node coupled to one plate of the pre-sampling capacitor $C'_{ps0}$, and yet another switch with a first node coupled to the pre-defined voltage $V_{pd}$ (e.g., $V_{pd}=V_{bias}$ or $V_{pd}=V_{cm}$) and a second node coupled to one plate of the pre-sampling capacitor $C'_{ps-1}$.

The switch group SG5 has one switch with a first node coupled to the non-inverting input node of the operational amplifier OPAMP and a second node coupled to one plate of the pre-sampling capacitor $C_{ps1}$, another switch with a first node coupled to the non-inverting input node of the operational amplifier OPAMP and a second node coupled to one plate of the pre-sampling capacitor $C_{ps0}$, and yet another switch with a first node coupled to the non-inverting input node of the operational amplifier OPAMP and a second node coupled to one plate of the pre-sampling capacitor $C_{ps-1}$.

The switch group SG' 5 has one switch with a first node coupled to the inverting input node of the operational amplifier OPAMP and a second node coupled to one plate of the pre-sampling capacitor $C'_{ps1}$ another switch with a first node coupled to the inverting input node of the operational amplifier OPAMP and a second node coupled to one plate of the pre-sampling capacitor $C'_{ps0}$, and yet another switch with a first node coupled to the inverting input node of the operational amplifier OPAMP and a second node coupled to one plate of the pre-sampling capacitor $C_{ps-1}$.

During the sampling cycle of the MDAC 2000, all switches included in the switch groups SG1 and SG'1 are switched on, and all switches included in the switch groups SG5 and SG'5 are switched off. During the conversion cycle of the MDAC 2000, all switches included in the switch groups SG1 and SG'1 are switched off, and all switches included in the switch groups SG5 and SG'5 are switched on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multiplying digital-to-analog converter (MDAC) comprising:
   an operational amplifier, having an input port and an output port;
   a sampling capacitor circuit;
   a pre-sampling capacitor circuit; and
   a switch circuit, arranged to control interconnection between the operational amplifier, the sampling capacitor circuit, and the pre-sampling capacitor circuit;
   wherein during a sampling cycle of the MDAC, the switch circuit is arranged to connect a pre-defined voltage to the pre-sampling capacitor circuit, connect a plurality of reference voltages to the pre-sampling capacitor circuit, disconnect the pre-sampling capacitor circuit from the input port of the operational amplifier, disconnect the pre-sampling capacitor circuit from the sampling capacitor circuit, disconnect the output port of the operational amplifier from the sampling capacitor circuit, and connect a voltage input of the MDAC to the sampling capacitor circuit; and
   wherein during a conversion cycle of the MDAC, the switch circuit is arranged to connect the pre-sampling capacitor circuit to the sampling capacitor circuit, where a configuration of connection between the pre-sampling capacitor circuit and the sampling capacitor circuit depends on a quantization result of the voltage input, and is further arranged to disconnect the pre-defined voltage from the pre-sampling capacitor circuit, disconnect said plurality of reference voltages from the pre-sampling capacitor circuit, connect the pre-sampling capacitor circuit to the input port of the operational amplifier, connect the output port of the operational amplifier to the sampling capacitor circuit, and disconnect the voltage input from the sampling capacitor circuit.

2. The MDAC of claim 1, wherein the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and the switch circuit comprises:
- a first switch, having a first node coupled to the pre-defined voltage and a second node coupled to one plate of each of the first pre-sampling capacitor, the second pre-sampling capacitor, and the third pre-sampling capacitor, wherein the first switch is switched on during the sampling cycle and is switched off during the conversion cycle; and
- a second switch, having a first node coupled to the pre-defined voltage and a second node coupled to one plate of each of the fourth pre-sampling capacitor, the fifth pre-sampling capacitor, and the sixth pre-sampling capacitor, wherein the second switch is switched on during the sampling cycle and is switched off during the conversion cycle.

3. The MDAC of claim 1, wherein the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and the switch circuit comprises:
- a first switch group, having one switch with a first node coupled to the pre-defined voltage and a second node coupled to one plate of the first pre-sampling capacitor, another switch with a first node coupled to the pre-defined voltage and a second node coupled to one plate of the second pre-sampling capacitor, and yet another switch with a first node coupled to the pre-defined voltage and a second node coupled to one plate of the third pre-sampling capacitor; and
- a second switch group, having one switch with a first node coupled to the pre-defined voltage and a second node coupled to one plate of the fourth pre-sampling capacitor, another switch with a first node coupled to the pre-defined voltage and a second node coupled to one plate of the fifth pre-sampling capacitor, and yet another switch with a first node coupled to the pre-defined voltage and a second node coupled to one plate of the sixth pre-sampling capacitor;
- wherein all switches included in the first switch group and the second switch group are switched on during the sampling cycle and are switched off during the conversion cycle.

4. The MDAC of claim 1, wherein the input port of the operational amplifier comprises a non-inverting input node and an inverting input node; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and
the switch circuit comprises:
- a first switch, having a first node coupled to the non-inverting input node of the operational amplifier and a second node coupled to one plate of each of the first pre-sampling capacitor, the second pre-sampling capacitor, and the third pre-sampling capacitor, wherein the first switch is switched off during the sampling cycle and is switched on during the conversion cycle; and
- a second switch, having a first node coupled to the inverting input node of the operational amplifier and a second node coupled to one plate of each of the fourth pre-sampling capacitor, the fifth pre-sampling capacitor, and the sixth pre-sampling capacitor, wherein the second switch is switched off during the sampling cycle and is switched on during the conversion cycle.

5. The MDAC of claim 1, wherein the input port of the operational amplifier comprises a non-inverting input node and an inverting input node; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and
the switch circuit comprises:
- a first switch group, having one switch with a first node coupled to the non-inverting input node of the operational amplifier and a second node coupled to one plate of the first pre-sampling capacitor, another switch with a first node coupled to the non-inverting input node of the operational amplifier and a second node coupled to one plate of the second pre-sampling capacitor, and yet another switch with a first node coupled to the non-inverting input node of the operational amplifier and a second node coupled to one plate of the third pre-sampling capacitor; and
- a second switch group, having one switch with a first node coupled to the inverting input node of the operational amplifier and a second node coupled to one plate of the fourth pre-sampling capacitor, another switch with a first node coupled to the inverting input node of the operational amplifier and a second node coupled to one plate of the fifth pre-sampling capacitor, and yet another switch with a first node coupled to the inverting input node of the operational amplifier and a second node coupled to one plate of the sixth pre-sampling capacitor;
- wherein all switches included in the first switch group and the second switch group are switched off during the sampling cycle and are switched on during the conversion cycle.

6. The MDAC of claim 1, wherein said plurality of reference voltages comprise a first reference voltage, a second reference voltage, and a third reference voltage; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor, where first plates of the first pre-sampling capacitor, the second pre-sampling capacitor, and the third pre-sampling capacitor are coupled to one another, and first plates of the fourth pre-sampling capacitor, the fifth pre-sampling capacitor, and the sixth pre-sampling capacitor are coupled to one another; and the switch circuit comprises:
- a first switch, having a first node coupled to the first reference voltage and a second node coupled to a second plate of the first pre-sampling capacitor, wherein the first switch is switched on during the sampling cycle and is switched off during the conversion cycle;
- a second switch, having a first node coupled to the second reference voltage and a second node coupled to a second plate of the second pre-sampling capacitor, wherein the second switch is switched on during the sampling cycle and is switched off during the conversion cycle;
- a third switch, having a first node coupled to the third reference voltage and a second node coupled to a second plate of the third pre-sampling capacitor, wherein the third switch is switched on during the sampling cycle and is switched off during the conversion cycle;

a fourth switch, having a first node coupled to the third reference voltage and a second node coupled to a second plate of the fourth pre-sampling capacitor, wherein the fourth switch is switched on during the sampling cycle and is switched off during the conversion cycle;

a fifth switch, having a first node coupled to the second reference voltage and a second node coupled to a second plate of the fifth pre-sampling capacitor, wherein the fifth switch is switched on during the sampling cycle and is switched off during the conversion cycle; and a sixth switch, having a first node coupled to the first reference voltage and a second node coupled to a second plate of the sixth pre-sampling capacitor, wherein the sixth switch is switched on during the sampling cycle and is switched off during the conversion cycle.

7. The MDAC of claim 1, wherein the sampling capacitor circuit comprises a first sampling capacitor and a second sampling capacitor; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor, where first plates of the first pre-sampling capacitor, the second pre-sampling capacitor, and the third pre-sampling capacitor are coupled to one another, and first plates of the fourth pre-sampling capacitor, the fifth pre-sampling capacitor, and the sixth pre-sampling capacitor are coupled to one another; and the switch circuit comprises:

a first switch, having a first node coupled to a second plate of the first pre-sampling capacitor and a second node coupled to one plate of the first sampling capacitor, wherein the first switch is switched off during the sampling cycle, and is selectively switched on in response to the quantization result of the voltage input during the conversion cycle;

a second switch, having a first node coupled to a second plate of the second pre-sampling capacitor and a second node coupled to said one plate of the first sampling capacitor, wherein the second switch is switched off during the sampling cycle, and is selectively switched on in response to the quantization result of the voltage input during the conversion cycle;

a third switch, having a first node coupled to a second plate of the third pre-sampling capacitor and a second node coupled to said one plate of the first sampling capacitor, wherein the third switch is switched off during the sampling cycle, and is selectively switched on in response to the quantization result of the voltage input during the conversion cycle;

a fourth switch, having a first node coupled to a second plate of the fourth pre-sampling capacitor and a second node coupled to one plate of the second sampling capacitor, wherein the fourth switch is switched off during the sampling cycle, and is selectively switched on in response to the quantization result of the voltage input during the conversion cycle;

a fifth switch, having a first node coupled to a second plate of the fifth pre-sampling capacitor and a second node coupled to said one plate of the second sampling capacitor, wherein the fifth switch is switched off during the sampling cycle, and is selectively switched on in response to the quantization result of the voltage input during the conversion cycle;

a sixth switch, having a first node coupled to a second plate of the sixth pre-sampling capacitor and a second node coupled to said one plate of the second sampling capacitor, wherein the sixth switch is switched off during the sampling cycle, and is selectively switched on in response to the quantization result of the voltage input during the conversion cycle.

8. The MDAC of claim 1, wherein the output port of the operational amplifier comprises a non-inverting output node and an inverting output node; the sampling capacitor circuit comprises a first sampling capacitor and a second sampling capacitor; and the switch circuit comprises:

a first switch, having a first node coupled to the inverting output node of the operational amplifier and a second node coupled to one plate of the first sampling capacitor, wherein the first switch is switched off during the sampling cycle and is switched on during the conversion cycle; and a second switch, having a first node coupled to the non-inverting output node of the operational amplifier and a second node coupled to one plate of the second sampling capacitor, wherein the second switch is switched off during the sampling cycle and is switched on during the conversion cycle.

9. The MDAC of claim 1, wherein the voltage input is a differential input comprising a positive signal and a negative signal; the sampling capacitor circuit comprises a first sampling capacitor and a second sampling capacitor; and the switch circuit comprises:

a first switch, having a first node coupled to the negative signal and a second node coupled to a first plate of the first sampling capacitor, wherein the first switch is switched on during the sampling cycle and is switched off during the conversion cycle;

a second switch, having a first node coupled to the positive signal and a second node coupled to a second plate of the first sampling capacitor, wherein the second switch is switched on during the sampling cycle and is switched off during the conversion cycle;

a third switch, having a first node coupled to the positive signal and a second node coupled to a first plate of the second sampling capacitor, wherein the third switch is switched on during the sampling cycle and is switched off during the conversion cycle; and a fourth switch, having a first node coupled to the negative signal and a second node coupled to a second plate of the second sampling capacitor, wherein the fourth switch is switched on during the sampling cycle and is switched off during the conversion cycle.

10. The MDAC of claim 1, wherein the operational amplifier is a single-stage differential amplifier with no tail current source.

11. The MDAC of claim 1, further comprising:
a first correlated-level-shifting (CLS) capacitor; and
a second CLS capacitor;
wherein the output port of the operational amplifier comprises a non-inverting output node and an inverting output node; the sampling capacitor circuit comprises a first sampling capacitor and a second sampling capacitor; one plate of the first sampling capacitor is coupled to a first plate of the first CLS capacitor; one plate of the second sampling capacitor is coupled to a first plate of the second CLS capacitor; and the switch circuit comprises:

a first switch, having a first node coupled to said one plate of the first sampling capacitor and a second node coupled to the inverting output node of the operational amplifier, wherein the first switch is switched on during a first phase of the conversion cycle, and is switched off during a second phase of the conversion cycle;

a second switch, having a first node coupled to said one plate of the second sampling capacitor and a second node coupled to the non-inverting output node of the operational amplifier, wherein the second switch is switched on during the first phase of the conversion cycle, and is switched off during the second phase of the conversion cycle;

a third switch, having a first node coupled to a second plate of the first CLS capacitor and a second node coupled to a second plate of the second CLS capacitor, wherein the third switch is switched on during a starting period of the second phase of the conversion cycle, and is switched off during a remaining period of the second phase of the conversion cycle;

a fourth switch, having a first node coupled to the inverting node of the operational amplifier and a second node coupled to the first node of the third switch, wherein the fourth switch is switched off during the first phase of the conversion cycle, and is switched on during the second phase of the conversion cycle; and a fifth switch, having a first node coupled to the non-inverting node of the operational amplifier and a second node coupled to the second node of the third switch, wherein the fifth switch is switched off during the first phase of the conversion cycle, and is switched on during the second phase of the conversion cycle.

12. The MDAC of claim 11, wherein during the second phase of the conversion cycle, a voltage difference between said one plate of the first sampling capacitor and said one plate of the second sampling capacitor acts as an MDAC output.

13. The MDAC of claim 1, wherein the pre-defined voltage is a bias voltage of the operational amplifier.

14. The MDAC of claim 1, wherein the pre-defined voltage is one of the reference voltages.

15. A pipelined analog-to-digital converter (ADC) comprising:
a plurality of stages, connected in a pipeline and arranged to generate a plurality of digital outputs, respectively; and
a combining circuit, arranged to combine said plurality of digital outputs;
wherein at least one of said plurality of stages comprises:
a quantization circuit, arranged to generate a quantization result of a voltage input of said at least one of said plurality of stages, wherein a digital output of said at least one of said plurality of stages depends on the quantization result of the voltage input; and
a multiplying digital-to-analog converter (MDAC), comprising:
an operational amplifier, having an input port and an output port;
a sampling capacitor circuit;
a pre-sampling capacitor circuit; and
a switch circuit, arranged to control interconnection between the operational amplifier, the sampling capacitor circuit, and the pre-sampling capacitor circuit;
wherein during a sampling cycle of the MDAC, the switch circuit is arranged to connect a pre-defined voltage to the pre-sampling capacitor circuit, connect a plurality of reference voltages to the pre-sampling capacitor circuit, disconnect the pre-sampling capacitor circuit from the input port of the operational amplifier, disconnect the pre-sampling capacitor circuit from the sampling capacitor circuit, disconnect the output port of the operational amplifier from the sampling capacitor circuit, and connect a voltage input of the MDAC to the sampling capacitor circuit; and
wherein during a conversion cycle of the MDAC, the switch circuit is arranged to connect the pre-sampling capacitor circuit to the sampling capacitor circuit, where a configuration of connection between the pre-sampling capacitor circuit and the sampling capacitor circuit depends on the quantization result of the voltage input, and is further arranged to disconnect the pre-defined voltage from the pre-sampling capacitor circuit, disconnect said plurality of reference voltages from the pre-sampling capacitor circuit, connect the pre-sampling capacitor circuit to the input port of the operational amplifier, connect the output port of the operational amplifier to the sampling capacitor circuit, and disconnect the voltage input from the sampling capacitor circuit.

16. A multiplying digital-to-analog converter (MDAC) comprising:
an operational amplifier;
a sampling capacitor circuit; and
a pre-sampling capacitor circuit;
wherein during a sampling cycle of the MDAC, the pre-sampling capacitor circuit operates to sample and hold a plurality of pre-sampled reference voltages, and the sampling capacitor circuit operates to sample a voltage input of the MDAC; and
wherein during a conversion cycle of the MDAC, the pre-sampling capacitor circuit is coupled to the sampling capacitor circuit, the operational amplifier operates to set a voltage output at an output port of the operational amplifier according to the voltage input and one of said plurality of pre-sampled reference voltages, a configuration between the pre-sampling capacitor circuit and the sampling capacitor circuit depends on a quantization result of the voltage input, and the voltage output is derived from voltage combination that is based on the voltage input and said one of said plurality of pre-sampled reference voltages.

17. The MDAC of claim 16, wherein the operational amplifier has a feedback factor equal to one, and there is no charge flowing between the pre-sampling capacitor circuit and the sampling capacitor circuit.

18. The MDAC of claim 16, wherein there is no voltage change at one capacitor plate of the pre-sampling capacitor circuit that receives one reference voltage from a reference buffer.

19. The MDAC of claim 16, further comprising:
a switch circuit, arranged to control interconnection between the operational amplifier, the sampling capacitor circuit, and the pre-sampling capacitor circuit;
wherein during the sampling cycle of the MDAC, the switch circuit is arranged to allow the pre-sampling capacitor circuit to sample and hold said plurality of pre-sampled reference voltages, and allow the sampling capacitor circuit to sample the voltage input of the MDAC; and
wherein during the conversion cycle of the MDAC, the switch circuit is arranged to connect the pre-sampling capacitor circuit to the sampling capacitor circuit, and allow the operational amplifier to set the voltage output at the output port of the operational amplifier according to the voltage input and said one of said plurality of pre-sampled reference voltages, and a configuration of connection between the pre-sampling capacitor circuit and the sampling capacitor circuit depends on the quantization result of the voltage input.

20. The MDAC of claim 19, wherein the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and the switch circuit comprises:
- a first switch, having a first node coupled to a pre-defined voltage and a second node coupled to one plate of each of the first pre-sampling capacitor, the second pre-sampling capacitor, and the third pre-sampling capacitor, wherein the first switch is switched on during the sampling cycle and is switched off during the conversion cycle; and
- a second switch, having a first node coupled to the pre-defined voltage and a second node coupled to one plate of each of the fourth pre-sampling capacitor, the fifth pre-sampling capacitor, and the sixth pre-sampling capacitor, wherein the second switch is switched on during the sampling cycle and is switched off during the conversion cycle.

21. The MDAC of claim 19, wherein the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and the switch circuit comprises:
- a first switch group, having one switch with a first node coupled to a pre-defined voltage and a second node coupled to one plate of the first pre-sampling capacitor, another switch with a first node coupled to the pre-defined voltage and a second node coupled to one plate of the second pre-sampling capacitor, and yet another switch with a first node coupled to the pre-defined voltage and a second node coupled to one plate of the third pre-sampling capacitor; and
- a second switch group, having one switch with a first node coupled to the pre-defined voltage and a second node coupled to one plate of the fourth pre-sampling capacitor, another switch with a first node coupled to the pre-defined voltage and a second node coupled to one plate of the fifth pre-sampling capacitor, and yet another switch with a first node coupled to the pre-defined voltage and a second node coupled to one plate of the sixth pre-sampling capacitor;
- wherein all switches included in the first switch group and the second switch group are switched on during the sampling cycle and are switched off during the conversion cycle.

22. The MDAC of claim 19, wherein an input port of the operational amplifier comprises a non-inverting input node and an inverting input node; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and the switch circuit comprises:
- a first switch, having a first node coupled to the non-inverting input node of the operational amplifier and a second node coupled to one plate of each of the first pre-sampling capacitor, the second pre-sampling capacitor, and the third pre-sampling capacitor, wherein the first switch is switched off during the sampling cycle and is switched on during the conversion cycle; and
- a second switch, having a first node coupled to the inverting input node of the operational amplifier and a second node coupled to one plate of each of the fourth pre-sampling capacitor, the fifth pre-sampling capacitor, and the sixth pre-sampling capacitor, wherein the second switch is switched off during the sampling cycle and is switched on during the conversion cycle.

23. The MDAC of claim 19, wherein an input port of the operational amplifier comprises a non-inverting input node and an inverting input node; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor; and the switch circuit comprises:
- a first switch group, having one switch with a first node coupled to the non-inverting input node of the operational amplifier and a second node coupled to one plate of the first pre-sampling capacitor, another switch with a first node coupled to the non-inverting input node of the operational amplifier and a second node coupled to one plate of the second pre-sampling capacitor, and yet another switch with a first node coupled to the non-inverting input node of the operational amplifier and a second node coupled to one plate of the third pre-sampling capacitor; and
- a second switch group, having one switch with a first node coupled to the inverting input node of the operational amplifier and a second node coupled to one plate of the fourth pre-sampling capacitor, another switch with a first node coupled to the inverting input node of the operational amplifier and a second node coupled to one plate of the fifth pre-sampling capacitor, and yet another switch with a first node coupled to the inverting input node of the operational amplifier and a second node coupled to one plate of the sixth pre-sampling capacitor;
- wherein all switches included in the first switch group and the second switch group are switched off during the sampling cycle and are switched on during the conversion cycle.

24. The MDAC of claim 19, wherein the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor, where first plates of the first pre-sampling capacitor, the second pre-sampling capacitor, and the third pre-sampling capacitor are coupled to one another, and first plates of the fourth pre-sampling capacitor, the fifth pre-sampling capacitor, and the sixth pre-sampling capacitor are coupled to one another; and the switch circuit comprises:
- a first switch, having a first node coupled to a first reference voltage and a second node coupled to a second plate of the first pre-sampling capacitor, wherein the first switch is switched on during the sampling cycle and is switched off during the conversion cycle;
- a second switch, having a first node coupled to a second reference voltage and a second node coupled to a second plate of the second pre-sampling capacitor, wherein the second switch is switched on during the sampling cycle and is switched off during the conversion cycle;
a third switch, having a first node coupled to a third reference voltage and a second node coupled to a second plate of the third pre-sampling capacitor, wherein the third switch is switched on during the sampling cycle and is switched off during the conversion cycle;
a fourth switch, having a first node coupled to the third reference voltage and a second node coupled to a second plate of the fourth pre-sampling capacitor, wherein the fourth switch is switched on during the sampling cycle and is switched off during the conversion cycle;
a fifth switch, having a first node coupled to the second reference voltage and a second node coupled to a second plate of the fifth pre-sampling capacitor, wherein the fifth switch is switched on during the sampling cycle and is switched off during the conversion cycle; and
a sixth switch, having a first node coupled to the first reference voltage and a second node coupled to a second plate of the sixth pre-sampling capacitor, wherein the sixth switch is switched on during the sampling cycle and is switched off during the conversion cycle.

25. The MDAC of claim 19, wherein the sampling capacitor circuit comprises a first sampling capacitor and a second sampling capacitor; the pre-sampling capacitor circuit comprises a first pre-sampling capacitor, a second pre-sampling capacitor, a third pre-sampling capacitor, a fourth pre-sampling capacitor, a fifth pre-sampling capacitor, and a sixth pre-sampling capacitor, where first plates of the first pre-sampling capacitor, the second pre-sampling capacitor, and the third pre-sampling capacitor are coupled to one another, and first plates of the fourth pre-sampling capacitor, the fifth pre-sampling capacitor, and the sixth pre-sampling capacitor are coupled to one another; and the switch circuit comprises:
a first switch, having a first node coupled to a second plate of the first pre-sampling capacitor and a second node coupled to one plate of the first sampling capacitor, wherein the first switch is switched off during the sampling cycle, and is selectively switched on in response to the quantization result of the voltage input during the conversion cycle;
a second switch, having a first node coupled to a second plate of the second pre-sampling capacitor and a second node coupled to said one plate of the first sampling capacitor, wherein the second switch is switched off during the sampling cycle, and is selectively switched on in response to the quantization result of the voltage input during the conversion cycle;
a third switch, having a first node coupled to a second plate of the third pre-sampling capacitor and a second node coupled to said one plate of the first sampling capacitor, wherein the third switch is switched off during the sampling cycle, and is selectively switched on in response to the quantization result of the voltage input during the conversion cycle;
a fourth switch, having a first node coupled to a second plate of the fourth pre-sampling capacitor and a second node coupled to one plate of the second sampling capacitor, wherein the fourth switch is switched off during the sampling cycle, and is selectively switched on in response to the quantization result of the voltage input during the conversion cycle;
a fifth switch, having a first node coupled to a second plate of the fifth pre-sampling capacitor and a second node coupled to said one plate of the second sampling capacitor, wherein the fifth switch is switched off during the sampling cycle, and is selectively switched on in response to the quantization result of the voltage input during the conversion cycle;
a sixth switch, having a first node coupled to a second plate of the sixth pre-sampling capacitor and a second node coupled to said one plate of the second sampling capacitor, wherein the sixth switch is switched off during the sampling cycle, and is selectively switched on in response to the quantization result of the voltage input during the conversion cycle.

26. The MDAC of claim 19, wherein the output port of the operational amplifier comprises a non-inverting output node and an inverting output node; the sampling capacitor circuit comprises a first sampling capacitor and a second sampling capacitor; and the switch circuit comprises:
a first switch, having a first node coupled to the inverting output node of the operational amplifier and a second node coupled to one plate of the first sampling capacitor, wherein the first switch is switched off during the sampling cycle and is switched on during the conversion cycle; and
a second switch, having a first node coupled to the non-inverting output node of the operational amplifier and a second node coupled to one plate of the second sampling capacitor, wherein the second switch is switched off during the sampling cycle and is switched on during the conversion cycle.

27. The MDAC of claim 19, wherein the voltage input is a differential input comprising a positive signal and a negative signal; the sampling capacitor circuit comprises a first sampling capacitor and a second sampling capacitor; and the switch circuit comprises:
a first switch, having a first node coupled to the negative signal and a second node coupled to a first plate of the first sampling capacitor, wherein the first switch is switched on during the sampling cycle and is switched off during the conversion cycle;
a second switch, having a first node coupled to the positive signal and a second node coupled to a second plate of the first sampling capacitor, wherein the second switch is switched on during the sampling cycle and is switched off during the conversion cycle;
a third switch, having a first node coupled to the positive signal and a second node coupled to a first plate of the second sampling capacitor, wherein the third switch is switched on during the sampling cycle and is switched off during the conversion cycle; and
a fourth switch, having a first node coupled to the negative signal and a second node coupled to a second plate of the second sampling capacitor, wherein the fourth switch is switched on during the sampling cycle and is switched off during the conversion cycle.

28. The MDAC of claim 19, wherein the operational amplifier is a single-stage differential amplifier with no tail current source.

29. The MDAC of claim 19, further comprising:
a first correlated-level-shifting (CLS) capacitor; and
a second CLS capacitor;
wherein the output port of the operational amplifier comprises a non-inverting output node and an inverting output node; the sampling capacitor circuit comprises a first sampling capacitor and a second sampling capacitor; one plate of the first sampling capacitor is coupled to a first plate of the first CLS capacitor; one plate of the second sampling capacitor is coupled to a first plate of the second CLS capacitor; and the switch circuit comprises:

a first switch, having a first node coupled to said one plate of the first sampling capacitor and a second node coupled to the inverting output node of the operational amplifier, wherein the first switch is switched on during a first phase of the conversion cycle, and is switched off during a second phase of the conversion cycle;

a second switch, having a first node coupled to said one plate of the second sampling capacitor and a second node coupled to the non-inverting output node of the operational amplifier, wherein the second switch is switched on during the first phase of the conversion cycle, and is switched off during the second phase of the conversion cycle;

a third switch, having a first node coupled to a second plate of the first CLS capacitor and a second node coupled to a second plate of the second CLS capacitor, wherein the third switch is switched on during a starting period of the second phase of the conversion cycle, and is switched off during a remaining period of the second phase of the conversion cycle;

a fourth switch, having a first node coupled to the inverting node of the operational amplifier and a second node coupled to the first node of the third switch, wherein the fourth switch is switched off during the first phase of the conversion cycle, and is switched on during the second phase of the conversion cycle; and a fifth switch, having a first node coupled to the non-inverting node of the operational amplifier and a second node coupled to the second node of the third switch, wherein the fifth switch is switched off during the first phase of the conversion cycle, and is switched on during the second phase of the conversion cycle.

30. The MDAC of claim 29, wherein during the second phase of the conversion cycle, a voltage difference between said one plate of the first sampling capacitor and said one plate of the second sampling capacitor acts as an MDAC output.

31. A pipelined analog-to-digital converter (ADC) comprising:
a plurality of stages, connected in a pipeline and arranged to generate a plurality of digital outputs, respectively; and
a combining circuit, arranged to combine said plurality of digital outputs;
wherein at least one of said plurality of stages comprises:
a quantization circuit, arranged to generate a quantization result of a voltage input of said at least one of said plurality of stages, wherein a digital output of said at least one of said plurality of stages depends on the quantization result of the voltage input; and
a multiplying digital-to-analog converter (MDAC) comprising:
an operational amplifier;
a sampling capacitor circuit; and
a pre-sampling capacitor circuit;
wherein during a sampling cycle of the MDAC, the pre-sampling capacitor circuit operates to sample and hold a plurality of pre-sampled reference voltages, and the sampling capacitor circuit operates to sample the voltage input; and
wherein during a conversion cycle of the MDAC, the pre-sampling capacitor circuit is coupled to the sampling capacitor circuit, and the operational amplifier operates to set a voltage output at an output port of the operational amplifier according to the voltage input and one of said plurality of pre-sampled reference voltages, a configuration between the pre-sampling capacitor circuit and the sampling capacitor circuit depends on the quantization result of the voltage input, and the voltage output is derived from voltage combination that is based on the voltage input and said one of said plurality of pre-sampled reference voltages.

32. The pipelined ADC of claim 31, wherein the operational amplifier has a feedback factor equal to one, there is no charge flowing between the pre-sampling capacitor circuit and the sampling capacitor circuit.

33. The pipelined ADC of claim 31, wherein and there is no voltage change at one capacitor plate of the pre-sampling capacitor circuit that receives one reference voltage from a reference buffer.

* * * * *